United States Patent [19]

Kakimi

[11] Patent Number: 5,021,319

[45] Date of Patent: Jun. 4, 1991

[54] LIGHT-SENSITIVE MATERIAL CONTAINING SILVER HALIDE, REDUCING AGENT, POLYMERIZABLE COMPOUND AND A FLUORINE ATOM-CONTAINING COMPOUND

[75] Inventor: Fujio Kakimi, Kanagawa, Japan

[73] Assignee: Fuji Photo Film Co., Ltd., Kanagawa, Japan

[21] Appl. No.: 409,207

[22] Filed: Sep. 19, 1989

[30] Foreign Application Priority Data

Sep. 19, 1988 [JP] Japan ................................. 63-235679

[51] Int. Cl.$^5$ .......................... G03C 1/68; G03C 1/76; B41M 5/12

[52] U.S. Cl. .................................... 430/138; 430/203; 430/281; 430/527

[58] Field of Search ................ 430/138, 203, 281, 527

[56] References Cited

U.S. PATENT DOCUMENTS

| | | | |
|---|---|---|---|
| 4,272,615 | 6/1981 | Yuneyama et al. | 430/527 |
| 4,596,766 | 6/1986 | Nemori et al. | 430/527 |
| 4,665,005 | 5/1987 | Aono et al. | 430/203 |
| 4,784,931 | 11/1988 | Aotsuka et al. | 430/203 |
| 4,824,756 | 4/1989 | Nakamura et al. | 430/138 |
| 4,833,062 | 5/1989 | Kakimi | 430/138 |
| 4,888,265 | 12/1989 | Kakimi et al. | 430/138 |
| 4,889,786 | 12/1989 | Takahashi | 430/138 |
| 4,891,307 | 1/1990 | Makunoki et al. | 430/527 |
| 4,897,335 | 1/1990 | Kakimi | 430/138 |
| 4,904,561 | 2/1990 | Yamamoto | 430/138 |

FOREIGN PATENT DOCUMENTS 203613 12/1986 European Pat. Off. .

OTHER PUBLICATIONS

Derwent Abstract of Japanese Patent Provisional Publication No. 61(1986)-51144.

*Primary Examiner*—Charles L. Bowers, Jr.
*Assistant Examiner*—Patrick A. Doody
*Attorney, Agent, or Firm*—Sughrue, Mion, Zinn, Macpeak & Seas

[57] ABSTRACT

A light-sensitive material comprises a support and a light-sensitive layer provided thereon which contains silver halide, a reducing agent and an ethylenically unsaturated polymerizable compound, and at least the silver halide and the polymerizable compound are contained in a microcapsule. The light-sensitive layer further contains a fluorine atom-containing compound.

7 Claims, No Drawings

LIGHT-SENSITIVE MATERIAL CONTAINING SILVER HALIDE, REDUCING AGENT, POLYMERIZABLE COMPOUND AND A FLUORINE ATOM-CONTAINING COMPOUND

FIELD OF THE INVENTION

The present invention relates to a light-sensitive material which comprises a support and a light-sensitive layer provided thereon which contains silver halide, a reducing agent and an ethylenically unsaturated polymerizable compound.

BACKGROUND OF THE INVENTION

A light-sensitive material comprising a support and a light-sensitive layer containing silver halide, a reducing agent and a polymerizable compound is used in an image forming method. The image-forming method comprises image-wise exposing to light the light-sensitive material to form a latent image of silver halide, and developing the light-sensitive material to imagewise polymerize the polymerizable compound.

Examples of the image-forming methods are described in Japanese Patent Publications No. 45(1970)-11149 (corresponding to U.S. Pat. No. 3,697,275), No. 47(1972)-20741 (corresponding to U.S. Pat. No. 3,687,667) and No. 49(1974)-10697, and Japanese Patent Provisional Publication No. 57(1982)-138632, No. 57(1982)-142638, No. 57(1982)-176033, No. 57(1982)-211146 (corresponding to U.S. Pat. No. 4,557,997), No. 58(1983)-107529 (corresponding to U.S. Pat. No. 4,560,637), No. 58(1983)-121031 (corresponding to U.S. Pat. No. 4,547,450) and No. 58(1983)-169143. In the image-forming method disclosed in the above-mentioned publications, when the exposed silver halide is developed using a developing solution, the polymerizable compound is induced to polymerize in the presence of a reducing agent to form a polymer image. Thus, this method needs a wet development process using a developing solution. Therefore, the process takes a relatively long time.

An improved image-forming method employing a dry process is described in Japanese Patent Provisional Publications No. 61(1986)-69062 and No. 61(1986)-73145 (the contents of both publications are described in U.S. Pat. No. 4,629,676 and European Patent Provisional Publication No. 0174634A2). In this image-forming method, a recording material (light-sensitive material) comprising a light-sensitive layer containing a light-sensitive silver salt (silver halide), a reducing agent, a polymerizable compound and a binder provided on a support is imagewise exposed to light to form a latent image, and then the material is heated to polymerize within the area where the latent image of the silver halide has been formed. The above-mentioned image-forming method using a dry process is also described in Japanese Patent Provisional Publications No. 61(1986)-183640 and No. 61(1986)-188535.

There is also known an image-forming method in which the polymerizable compound is polymerized within the area where a latent image of the silver halide has not been formed, as described in Japanese Patent Provisional Publication No. 61(1986)-260241. In this method, the polymerization of the polymerizable compound within the area where the latent image of the silver halide has been formed is inhibited, and simultaneously the polymerization of the polymerizable compound within other area (i.e., area where the latent image of the silver halide has not been formed) is accelerated.

The image-forming method using the light-sensitive material having the above constitution generally comprises the steps of forming imagewise a polymer compound on the light-sensitive material, superposing the light-sensitive material on an image-receiving material having an image-receiving layer, and pressing them to transfer the unpolymerized polymerizable compound on to the image-receiving material so as to obtain a transferred image on the image-receiving material. In this method, preferably employed is a light-sensitive material in which the silver halide and the polymerizable compound are contained in microcapsules (referred to hereinafter as "light-sensitive microcapsule(s)"), as described in Japanese Patent Provisional Publications No. 61(1986)-275742 and No. 61(1986)-278849.

In the above-mentioned image-forming method, the density (maximum density) of the transferred image is sometimes low, and at that time, a sufficient density of the image can be hardly obtained. Particularly in the case of performing heat (thermal) development process for a long period of time, decrease of image density is frequently observed.

SUMMARY OF THE INVENTION

An object of the invention is to provide a light-sensitive material which can give a transferred image of high density.

There is provided by the present invention a light-sensitive material comprising a support and a light-sensitive layer provided thereon which contains silver halide, a reducing agent and an ethylenically unsaturated polymerizable compound, at least the silver halide and the polymerizable compound being contained in a microcapsule;

wherein the light-sensitive layer further contains a fluorine atom-containing compound.

The present inventor has found that a transferred image of high density can be obtained when the above-mentioned image-forming method is conducted using a light-sensitive material having a light-sensitive layer which contains a fluorine atom-containing compound (also referred to as a fluorine-containing compound or a fluorine compound). The reason has not been clarified yet, but it is presumed that the contents (i.e., polymerizable compound) in microcapsules can move smoothly owing to the high oil repellency of the fluorine-containing compound onto the image-receiving material, and thereby the amount of the polymerizable compound transferred to the image-receiving material is increased. A color image is generally obtained by a color formation reaction in which a color image-forming substance (color former) contained in the light-sensitive layer and a developer contained in the image-receiving material are brought in to contact with each other in the transferring stage under pressure, so that it is also presumed that the affinity between the color former and the developer is increased due to the presence of the fluorine-containing compound, and as a result an image of high density is obtained.

In the case of preparing the light-sensitive material of the invention, the fluorine-containing compound tends to be adsorbed on interfaces (particularly, a surface of the shell of the microcapsule or a surface of the support on the light-sensitive layer side). Especially when the fluorine-containing compound is adsorbed on the surface of the shell of the microcapsule (that is, a part of the fluorine compound enters extremely small sized pores of the shell to seal the pores), oozing of the content of the light-sensitive microcapsule is restrained in the heat (thermal) development stage. Therefore, the decrease of the image density which caused by the reduction of the content of the microcapsule can be prevented.

Further, in the case of preparing a coating dispersion (solution) for the formation of a light-sensitive layer by adding the fluorine compound thereinto, the dispersibility of the microcapsules in the coating solution can be improved, whereby cohesion of the microcapsules can be prevented, and as a result, the obtained transferred image has a smooth surface thereon.

In the case of conducting the above-mentioned image-forming method, the light-sensitive material is liable to adhere to the image-receiving material in the transferring stage, resulting in difficult separation of the image-receiving material from the light-sensitive material. However, when the light-sensitive material containing the fluorine compound is employed, the separation between those materials can be easily made.

As described above, the image formation can be smoothly conducted and an excellent transferred image can be obtained by using the light-sensitive material containing the fluorine compound according to the present invention.

DETAILED DESCRIPTION OF THE INVENTION

The fluorine atom-containing compound employable in the invention preferably is highly hydrophobic and has a low water absorption. Particularly preferred as the fluorine-containing compound is a fluorine-containing surface active agent. The fluorine-containing surface active agent (may be an anionic, cationic, nonionic or amphoteric) may be a low-molecular weight compound or a high-molecular weight compound (may be in the form of latex).

Examples of the low-molecular weight compounds include those described in U.S. Pat. No. 3,775,126, U.S. Pat. No. 3,589,906, U.S. Pat. No. 3,798,265, U.S. Pat. No. 3,779,768 and U.S. Pat. No. 4,407,937, West German Patent No. 1,293,189, U.K. Patent No. 1,259,398, U.K. Patent Application No. 58,431, Japanese Patent Provisional Publications No. 48(1973)-87826, No. 49(1974)-10722, No. 49(1974)-46733, No. 50(1975)-16525 and No. 50(1975)-113221, No. 50(1975)-161236, No. 51(1976)-7917, No. 51(1976)-32322, No. 51(1976)-106419, No. 51(1976)-151124, No. 51(1976)-151125, No. 51(1976)-151126, No. 51(1976)-151127, No. 51(197)-129229, No. 52(1977)-127974, No. 53(1978)-84712, No. 53(1978)-146622, No. 54(1979)-14224, No. 54(1979)-48520, No. 55(1980)-7762, No. 56(1981)-114944, No. 58(1983)-16233, No. 59(1984)-23344, 60(1985)-244945 61(1986)-20944, No. 61(1986)-51144, No. 62(1986)-173463 and No. 62(1987)-283334, Japanese Patent Publications No. 48(1973)-43130 and No. 52(1977)-16073, Research Disclosure No. 16,630, Research Disclosure No. 17341, and Research Disclosure No. 17,611.

Examples of the high-molecular weight compounds include those described in U.S. Pat. No. 4,175,969, U.S. Pat. No. 4,087,394, U.S. Pat. No. 4,016,125, U.S. Pat. No. 3,676,123, U.S. Pat. No. 3,679,411 and U.S. Pat. No. 4,304,852, Japanese Patent Provisional Publications No. 52(1977)-129520, No. 54(1979)-158222, No. 55(1980)-57842, No, 57(1982)-11342, No. 57(1982)-19735 and No. 57(1982)-179837, "Elements of Chemistry, No. 27, New Fluorine Chemistry", published by Japan Chemistry Association, 1980, and "Functional Polymers Containing Fluorine" written by Satokawa, published by Daily Industrial News Paper, 1982.

Concrete examples of the preferred fluorine compounds employable for the light-sensitive material of the present invention are described below.

 (1)

 (2)

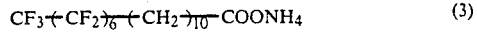 (3)

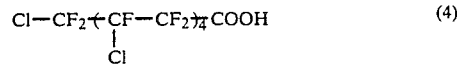 (4)

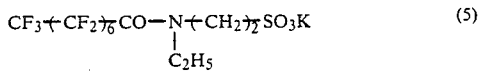 (5)

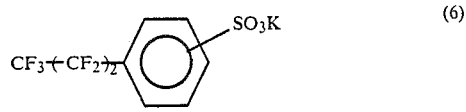 (6)

 (7)

 (8)

 (9)

 (10)

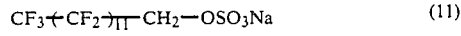 (11)

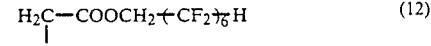 (12)

 (13)

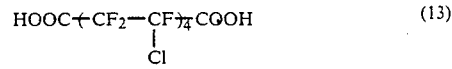 (14)

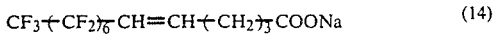 (15)

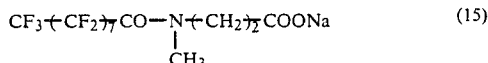 (16)

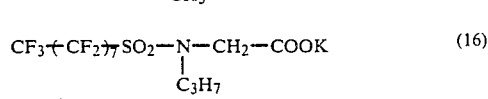 (17)

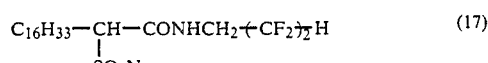 (18)

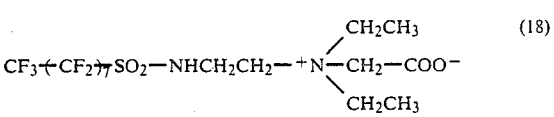 (19)

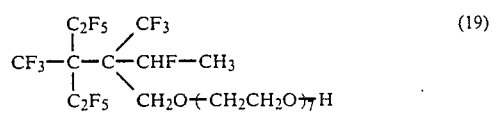 (20)

-continued $$CF_3(CF_2)_7SO_2-N(CH_2)_2O(CH_2CH_2O)_{10}H \quad (21)$$
$$\phantom{CF_3(CF_2)_7SO_2-N}|\phantom{(CH_2)_2O(CH_2CH_2O)_{10}H}$$
$$\phantom{CF_3(CF_2)_7SO_2-N}C_2H_5$$

$$H(CF_2)_{10}CH_2OH \quad (22)$$

$$CF_3-CF_2-COO(CH_2-CH-O)_4(CH_2CH_2O)_{20}H \quad (23)$$
$$\phantom{CF_3-CF_2-COO(CH_2-}|\phantom{CH-O)_4(CH_2CH_2O)_{20}H}$$
$$\phantom{CF_3-CF_2-COO(CH_2-}CH_3$$

$$CF_3(CF_2)_7SO_2NH(CH_2)_3{}^+N-(CH_3)_3 \cdot I^- \quad (24)$$

$$CF_3(CF_2)_6CO_2-NHCH_2CH_2-{}^+N\text{-pyridinium} \cdot I^- \quad (25)$$

$$CF_3(CF_2)_6CONH(CH_2)_3{}^+N(CH_3)_2CH_2CH_2-COO^- \quad (26)$$

$$CF_3(CF_2)_7SO_2NCH_2CH_2OSO_3H \quad (27)$$
$$\phantom{CF_3(CF_2)_7SO_2}|\phantom{NCH_2CH_2OSO_3H}$$
$$\phantom{CF_3(CF_2)_7SO_2}CH_3$$

(28) 2-heptadecafluoroheptyl-1-(2-hydroxyethyl)-1-(carboxymethyl) imidazolinium

(29) C$_7$F$_{15}$COOCH$_2$-disaccharide

(30) Branched perfluoroether dicarboxylic acid structure $$C_8F_{17}SO_2NCH_2CH_2OP(O)(OH)_2 \quad (31)$$
$$\phantom{C_8F_{17}SO_2}|\phantom{NCH_2CH_2OP(O)(OH)_2}$$
$$\phantom{C_8F_{17}SO_2}C_2H_5$$

$$CF_3(CF_2)_{12}COO(CH_2CH_2O)_{20}H \quad (32)$$

$$F(CF(CF_3)-CF_2O)_2CFCONH(CH_2)_3N(CH_3)_2 \rightarrow O \quad (33)$$

$$C_9F_{19}CONH(CH_2)_3{}^+N(CH_3)_2CH_2COO^- \quad (34)$$

-continued $$(C_2F_5)(CF_3)_2C-CH(CF_3)-CF(CF_3)-CONH(CH_2)_3{}^+N(CH_3)_3 \cdot Cl^- \quad (35)$$
with $C_2F_5$ branch $$(C_2F_5)(CF_3)_2C-CH(CF_3)-CF(CF_3)-CONH(CH_2)_2{}^+N\text{-pyridinium} \cdot Cl^- \quad (36)$$

$$(C_2F_5)(CF_3)_2C-CH(CF_3)-CF(CF_3)-SO_3Na \quad (37)$$

$$CF_3(CF_2)_7\text{-}C_6H_4\text{-}O(CH_2CH_2O)_7H \quad (38)$$

$$H(CF_2)_6CH_2O(CH_2CH_2O)_{10}H \quad (39)$$

$$H(CF_2)_6CH_2O(CH_2CH-O)_5H \quad (40)$$
$$\phantom{H(CF_2)_6CH_2O(CH_2}|\phantom{CH-O)_5H}$$
$$\phantom{H(CF_2)_6CH_2O(CH_2}OH$$

$$H(CF_2)_6CH_2O(CH_2CHCH_2O)_2(CH_2CH_2O)_5H \quad (41)$$
$$\phantom{H(CF_2)_6CH_2O(CH_2}|\phantom{CHCH_2O)_2(CH_2CH_2O)_5H}$$
$$\phantom{H(CF_2)_6CH_2O(CH}OH$$

$$C_8F_{17}SO_2-NH(CH_2)_3{}^+N(CH_2CH_2OCH_3)_3 \cdot I^- \quad (42)$$

$$C_8F_{17}SO_2NH(CH_2)_3{}^+N\text{-morpholinium-}CH_3 \cdot I^- \quad (43)$$

$$C_7F_{15}CONH(CH_2)_3{}^+N(CH_3)_2CH_2CH_2OCH_3 \cdot Br^- \quad (44)$$

$$C_9F_{19}O\text{-}C_6H_4\text{-}SO_2NH(CH_2)_3{}^+N(CH_3)_3 \cdot I^- \quad (45)$$

$$C_9F_{19}O\text{-}C_6H_4\text{-}OCH_2\text{-}^+N\text{-pyridinium} \cdot Cl^- \quad (46)$$

$$C_7F_{15}CONH(CH_2)_3{}^+N(CH_3)_3 \cdot Cl^- \quad (47)$$

$$C_8F_{17}SO_2NH(CH_2)_3{}^+N(CH_3)_2CH_2\text{-}C_6H_5 \cdot Cl^- \quad (48)$$

$$C_8F_{17}SO_2NH(CH_2)_3{}^+N(CH_3)_2C_6H_{13} \cdot Br^- \quad (49)$$

$$C_8F_{17}SO_2N(CH_3)(CH_2)_3{}^+N(CH_3)_3 \cdot I^- \quad (50)$$

$$C_{12}F_{25}O(CH_2CH_2)_5CH_2CH_2{}^+N(CH_3)_3 \cdot I^- \quad (51)$$

-continued

(52) $C_9F_{19}O$—⟨C₆H₄⟩—$SO_2NH(CH_2)_3{}^+N(CH_3)_3 \cdot CH_3SO_4{}^-$

(53) $C_9F_{19}NH(CH_2)_3{}^+N(CH_3)_2 \cdot Br^-$
$\qquad\qquad\qquad\quad\ \ |$
$\qquad\qquad\qquad\quad\ \ C_2H_5$

(54) $C_6F_{13}O$—⟨C₆H₄⟩—$CH_2$—⁺N⟨pyridinium⟩ $Cl^-$

(55) $C_9F_{19}CONH(CH_2)_3{}^+N(CH_3)_3 \cdot I^-$

(56) $C_8F_{17}SO_2$—$NH(CH_2)_3OCH_2CH_2\overset{+}{N}(CH_3)_3 \cdot CH_3$—⟨C₆H₄⟩—$SO_3^-$

(57) $C_8F_{17}CONH(CH_2)_3OCH_2CH_2\overset{+}{N}(CH_3)_3 \cdot CH_3$—⟨C₆H₄⟩—$SO_3^-$

(58) $C_8F_{17}SO_2NCH_2CH_2{}^+N(CH_3)_3 \cdot Br^-$
$\qquad\qquad |$
$\qquad\qquad CH_2CH_2OH$

(59) $C_8F_{17}SO_2NH(CH_2)_3OCH_2CH_2{}^+N(CH_3)_2 \cdot Br^-$
$\qquad\qquad\qquad\qquad\qquad\qquad\ |$
$\qquad\qquad\qquad\qquad\qquad\qquad\ CH_2CH_2OH$

(60) $H(CF_2)_8COOCH_2CH_2$—$^+N(CH_2CH_2OH)_3 \cdot Br^-$

(61) $C_7F_{15}CONH$—⟨pyridinium⟩—$^+N$—$CH_3 \cdot CH_3$—⟨C₆H₄⟩—$SO_3^-$

(62) $C_{12}F_{25}CONH(CH_2)_3OCH_2CH_2\overset{+}{N}(CH_3)_3 \cdot CH_3$—⟨C₆H₄⟩—$SO_3^-$

(63) $C_8F_{17}SO_2NH(CH_2)_3{}^+N(CH_3)_2 \cdot Br^-$
$\qquad\qquad\qquad\qquad\ |$
$\qquad\qquad\qquad\qquad\ CH_2CH_2OH$

(64) $C_8F_{17}SO_2N$⟨piperazinium with $CH_3$ and $CH_2CH_2OH$⟩ $\cdot Br^-$

(65) $C_8F_{17}SO_2NH(CH_2)_3$—⁺N⟨piperidinium, $H_3C$⟩ $I^-$

(66) $C_4F_9CH_2CH_2O(CH_2)_3{}^+N(CH_3)_3$

(67) $(C_4F_9CH_2CH_2)_2{}^+N(CH_3)_2 \cdot CH_3$—⟨C₆H₄⟩—$SO_3^-$

-continued

(68) $(C_8F_{17}SO_2NH(CH_2)_3)_2{}^+N(CH_2CH_2CH_2)_2 \cdot 2Br^-$
$\qquad\qquad\qquad\qquad\qquad\ \ |$
$\qquad\qquad\qquad\qquad\qquad\ \ CH_3$ (with two $CH_3$ groups)

(69) $H(CF_2)_6CO$
$\qquad\ \ \ \backslash$
$\qquad\quad\ N(CH_2)_3{}^+N(CH_3)_2 \cdot Br^-$
$\qquad\ \ \ /\qquad\qquad\ \ \ |$
$\ \ \ C_6H_{13}\qquad\qquad\ \ \ C_2H_5$

(70) 
$$-(CH_2-\underset{\underset{OCH_2CH_2{}^+N(C_2H_5)_2CH_3 \cdot CH_3SO_4^-}{\underset{|}{CO}}}{\overset{CH_3}{\underset{|}{C}}})_{80}-(CH_2-\underset{\underset{C_7F_{15}}{\underset{|}{CO}}}{\underset{|}{CH}})_{20}-$$

(71) $-(CH_2CH)_{30}-(CH_2-\overset{CH_3}{\underset{|}{C}})_{60}-(CH_2-\underset{\underset{N(CH_3)_2}{\underset{|}{CO}}}{CH})_{10}-$
with pendant pyridinium $-CH_3 \cdot CH_3SO_4^-$, $-CO-OCH_2(CF_2CF_2)_4H$

(72) $-(CH_2-CH)_{50}-(CH_2-CH)_{50}-$
with ⟨C₆H₄⟩ pendants, $-CH_2OCO(CF_2)_6H$

(73) $-(CH_2-CH)_{40}-(CH_2-CH)_{60}-$
$\qquad\qquad\ \ |\qquad\qquad\qquad\ \ |$
$\qquad ⟨C_6H_4⟩\qquad\qquad\ COOC_4H_9$
$\qquad\ \ |$
$\qquad CH_2OCO(CF_2)_6H$

(74) $-(CH_2-CH)_{30}-(CH_2-\overset{CH_3}{\underset{|}{C}})_{70}-$
$\qquad\qquad\ \ |\qquad\qquad\qquad\ \ |$
$\qquad ⟨C_6H_4⟩\qquad COOCH_2CH_2{}^+N(C_2H_5)(CH_3)_2 Cl^-$
$\qquad\ \ |$
$\qquad CH_2NHO_2SC_8F_{17}$

(75) $-(CH_2-CH)_{50}-(CH_2-CH)_{45}-(CH_2-CH)_5-$
with ⟨C₆H₄⟩ pendants, $-CH_2OCOC_7F_{15}$, $-(CH-CH_2-)$

(76) $-(CH_2CH)_{35}-(CH_2-CH)_{65}-$
with ⟨C₆H₄⟩ pendants, $-CH_2NHCOC_{10}F_{21}$, $-SO_3Na$

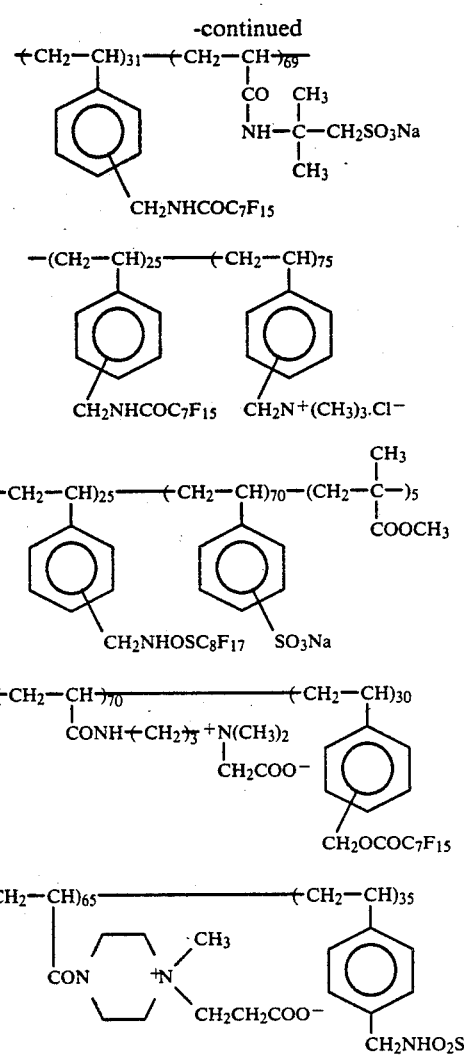

As the fluorine-containing compound, fluorine-containing silane coupling agents can be also employed in the invention.

The above-exemplified fluorine-containing surface active agents or fluorine-containing silane coupling agents can be employed singly or in combination of two or more compounds.

Commercially available fluorine-containing surface active agents can be preferably employed in the invention.

Examples of the commercially available fluorine-containing surface active agents include perfluoroalkylcarboxylate (available from Asahi Glass Co., Ltd. under tradename of Surfluon S-111), perfluoroalkylphosphate (available from Asahi Glass Co., Ltd. under tradename of Surfluon S-112), perfluoroalkylethylene oxide addition (available from Asahi Glass Co., Ltd. under tradename of Surfluon S-145), perfluoroalkylsulfonate (available from Dainippon Ink & Chemicals Inc. under tradename of Megafac F-110) and fluorinepolymer (available from Daikin Kogyo Co., Ltd. under tradename of Dyefree).

Among the above compounds, Surfluon S-112 is most preferred.

For incorporating the fluorine compound into the light-sensitive layer, the fluorine compound is added to a coating solution for the formation of a light-sensitive layer containing a light-sensitive microcapsule dispersion. A part of the fluorine compound added to the solution is adsorbed on the shell of the microcapsule in the stirring or mixing procedure owing to the chargeability of the fluorine compound itself or the chargeability of the microcapsule, and a part of the adsorbed fluorine compound penetrates into the extremely small sized pores of the shell. Particularly, the fluorine-containing surface active agent moves to the interface between the microcapsule and the aqueous medium in the light sensitive microcapsule dispersion and is adsorbed on the surface of the shell of the microcapsule. In order to readily conduct the adsorption of the fluorine compound on the shell, it is preferred to beforehand subject the light-sensitive microcapsule dispersion to washing procedure to remove an ionic substance (e.g., protective colloid) from the dispersion. Further, for accelerating the adsorption of the fluorine compound on the shell, there can be employed a method of providing an electric charge to the light sensitive microcapsule and using a fluorine compound having an opposite electric charge, so that the fluorine compound can be adsorbed on the surface of the shell of the microcapsule. The above-mentioned fluorine compound is preferably adsorbed on the shell of the light-sensitive microcapsule in an amount of 0.5 to 30 wt. % based on the amount of the light-sensitive microcapsule.

There is no specific limitation on the shell materials of the microcapsules. Light-sensitive materials using microcapsules having polyamide resin and/or polyester resin shell are described in Japanese Patent Provisional Publication No. 62(1987)-209437. Light-sensitive materials using microcapsules having polyurea resin and/or polyurethane resin shell are described in Japanese Patent Provisional Publication No. 62(1987)-209438. Light-sensitive materials using microcapsules having amino-aldehyde resin shell are described in Japanese Patent Provisional Publication No. 62(1987)-209439. Light-sensitive materials using microcapsules having gelatin shell are described in Japanese Patent Provisional Publication No. 62(1987)-209440. Light-sensitive materials using microcapsules having epoxy resin shell are described in Japanese Patent Provisional Publication No. 62(1987)-209441. Light-sensitive materials using microcapsules having multi-layer shell of polyamide resin and/or polyurea resin are described in Japanese Patent Provisional Publication No. 62(1987)-209447. Light-sensitive materials using microcapsules having multi-layer shell of polyurethane resin and/or polyester resin are described in Japanese Patent Provisional Publication No. 62.(1987).209442. Among those shell materials, an amino-aldehyde resin (particularly melamine-aldehyde resin) or an urea resin is preferred.

In the case of preparing a light-sensitive material by coating a coating solution for the formation of a light-sensitive layer containing the fluorine compound obtained as above, the fluorine compound is adsorbed on not only the surface of the microcapsule but also the light-sensitive layer side surface of the support. Accordingly, the fluorine compound exists in a larger amount in the light-sensitive layer in the vicinity of the support.

In the present invention, the fluorine compound is preferably contained in the light-sensitive layer in an amount of 0.05 to 1.5 g/m², more preferably 0.1 to 1.0 g/m².

The silver halide, the reducing agent, the polymerizable compound and the support which constitute the light-sensitive material are described below.

Examples of the silver halide employable in the light-sensitive material include silver chloride, silver bromide, silver iodide, silver chlorobromide, silver chloroiodide, silver iodobromide and silver chloroiodobromide in the form of grains.

The halogen composition of individual grains may be homogeneous or heterogeneous. The heterogeneous grains having a multi-layer structure in which the halogen composition varies from the outer surface portion (i.e., shell) to the inside portion (i.e., core) are described Japanese Patent Provisional Publication Nos. 57(1982)-154232, 58(1983)-108533, 59(1984)-48755 and 59(1984)-52237, U.S. Pat. No. 4,433,048, and European Patent No. 100,984. A silver halide grain having a core/shell structure in which the silver iodide content in the shell is higher than that in the core can be also employed as described in Japanese Patent Provisional Publication No. 62(1987)-183453.

There is no specific limitation on the crystal habit of silver halide grains. For example, a tubular grain having an aspect ratio of not less than 3 can be used as described in Japanese Patent Provisional Publication No. 62(1987)-210455.

It is preferred to use silver halide grains having a relatively low fogging value, as described in Japanese Patent Provisional Publication No. 63(1988)-68830.

Two or more kinds of silver halide grains which differ in halogen composition, crystal habit, grain size, and/or other features from each other can be employed in combination.

There is no specific limitation on the grain size distribution of silver halide grains. For example, silver halide grains having an almost uniform grain size distribution can be employed, as described in Japanese Patent Provisional Publication No. 62(1987)-210448.

The silver halide grains preferably have a mean grain (or particle) size of 0.001 to 5 $\mu$m, more preferably 0.001 to 2 $\mu$m.

The amount of the silver halide grains contained in the light-sensitive layer preferably is in the range of 0.1 mg/m$^2$ to 10 g/m$^2$ in terms of silver contained the silver halide and an organic silver salt which is one of optional components. The amount of the silver halide contained in the light-sensitive layer preferably is not more than 1 g/m$^2$, more preferably in the range of 1 to 500 mg/m$^2$, in terms of silver only contained in the silver halide.

The reducing agent employable in the light-sensitive material has a function of reducing the silver halide and/or a function of accelerating or restraining polymerization of the polymerizable compound. There are known various reducing agents having the above-mentioned function. Examples of such reducing agents include hydroquinone, catechol, p-aminophenol, p-phenylenediamine, 3-pyrazolidone, 3-aminopyrazole, 4-amino-5-pyrazolone, 5-aminouracil, 4,5-dihydroxy-6-aminopyrimidine, reductone, aminoreductone, o- or p-sulfonamidophenol, o- or p-sulfonamidonaphthol, 2-sulfonamidoindanone, 4-sulfonamido-5-pyrazolone, 3-sulfonamidoindole, sulfonamidopyrazolobenzimidazole, sulfonamidopyrazolotriazole, $\alpha$-sulfonamidoketone and hydrazine.

By adjusting the kind, amount, etc. of the above reducing agent, the polymerizable compound can be polymerized within the area where a latent image of the silver halide has been formed or the area where a latent image of the silver halide has not been formed. In the case that the polynerizable compound is polymerized within the area where the latent image of the silver halide has not been formed, preferably employed is 1-phenyl-3-pyrazolidone as the reducing agent.

Various reducing agents having the above-mentioned functions (including compounds referred to as developing agent, hydrazine derivative) are described in Japanese Patent Provisional Publications 61(1986)-183640, No. 61(1986)-183545, No. 61(1986)-228441, No. 62(1987)-70836, No. 61(1987)-86354, No. 62(1987)-86355, No. 62(1987)-198849, and Japanese Patent Application No. 60(1985)-227528. These reducing agents are also described in T. James, "The Theory of the Photographic Process", 4th edition, pp. 291-334 (1977), Research Disclosure Vol. 170, No. 17029, pp. 9-15 (June 1978), and Research Disclosure Vol 176, No. 17643, pp. 22-31 (December 1978). Further, there can be also employed a reducing agent precursor capable of releasing a reducing agent under heating or in contact with a base. In the light-sensitive material used in the invention, various reducing agents and reducing agent precursors described in the above publications, applications and literatures can be effectively employed. Thus, "the reducing agent(s)" in the present specification means to include all of the reducing agents and reducing agent precursors described in the above publications, etc.

These reducing agents can be used singly or in combination. In the case that two or more reducing agents are used in combination, certain interactions between there reducing agents may be expected. One of the interactions is for acceleration of reduction of silver halide (and/or an organic silver salt) through so-called super-additivity. Other interaction is for a chain reaction in which an oxidized state of one reducing agent formed by a reduction of silver halide (and/or an organic silver salt) induced or inhibits the polymerization of the polynerizable compound via oxidation-reduction reaction with other reducing agent. Both interactions may occur simultaneously. Thus, it is difficult to determine which of the interactions has occurred in practical use.

Concrete examples of the above-mentioned reducing agents include pentadecylhydroquinone, 5-t-butylcatechol, p-(N,N-diethylamino)phenol, 1-phenyl-4-methyl-4-hydoroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-3-t-butyl-5-hexadecyloxyphenol, 2-(N-butylcarbamoyl)-4-phenylsulfonylaminonaphthol and 2-(N-methyl-N-octadecylcarbamoyl)-4-sulfonylaminonaphthol, 1-acetyl-2-phenylhydrazine, 1-acetyl-2-{(p- or)o-aminophenyl}hydrazine, 1-formyl-2-{(p- or o)-aminophenyl}hydrazine, 1-acetyl-2-{(p- or o)-methoxy-phenyl}hydrazine, 1-lauroyl-2-{(p- or o-) aminophenyl}hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)butyloyl}-2-(p- or o-aminophenyl)-hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}-phenyl]-hydrazine, 1-{4-(2,5-di-tert-pentylphenoxy)-butyloyl}-2-(p- or o- methoxyphenyl)hydrazine, 1-(methoxycarbonylbenzohydryl)-2-phenylhydrazine, 1-formyl-2-[4-{2-(2,4-di-tert-pentylphenoxy)butylamide}phenyl hydrazine, 1-acetyl-2-[4-{2-(2,4-di-tert-pentylphenoxy)-butylamido}-phenyl]hydrazine, 1-trityl-2-[{2,6-dichloro-4-(N,N-di-2-ethylhexyl)carbamoyl}phenyl]-hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}-phenyl]-hydrazine, 1-benzoyl-2-tritylhyirazine, 1-(4-butoxybenzoyl)-2-tritylhydrazine, 1-(2,4-dimethoxybenzoyl)-2-tritylhydrazine, 1-(4-dibutylcarbamylbenzoyl)-2-tritylhydrazine and 1-(1-naphthoyl)-2-tritylhydrazine.

The amount of the reducing agent in the light-sensitive layer preferably ranges from 0.1 to 1,500 mole % based on 1 mole of silver (including the above-mentioned silver halide and the optional organic silver salt).

There is no specific limitation with respect to the polymerizable compound, except that the compound has to have an ethylenic unsaturated bond. Polymerizable liquid compounds having a relatively high boiling point (e.g., 80° C. or higher) that are hardly evaporated upon heating are preferably employed. In the case that the light-sensitive layer contains a color image-forming substance (optional component, described later), the polymerizable compounds are preferably cross-linkable compounds having plural polymerizable groups in the molecule, because such cross-linkable compounds favorably serve for fixing the color image forming substance in the course of polymerization-hardening of the polymerizable compounds. In the case of forming a transferred image on an image-receiving material (also described later), compounds having a high viscosity are preferably employed as the polymerizable compound, as in the light-sensitive material described in Japanese Patent Provisional Publication No. 61(1986)-150079.

The ethylenically unsaturated polymerizable compounds employable in the light-sensitive material are described in the aforementioned or later-mentioned publications concerning to light-sensitive materials.

Polymerizable compounds employable for the light-sensitive material are compounds which are polymerizable through addition reaction or ring-opening reaction. Examples of the compounds being polymerizable through addition reaction include compounds having an ethylenic unsaturated group. Examples of the compounds being polymerizable through ring-opening reaction include the compounds having an epoxy group. Preferred are compounds having one or more an ethylenic unsaturated groups.

Examples of the compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic acid esters, itaconic acid esters, styrene, styrene derivatives, vinyl ethers, vinyl esters, N-vinyl heterocyclic compounds, allyl ethers, allyl esters, and derivatives thereof.

Concrete examples of the acrylic esters include n-butyl acrylate, cyclohexyl acrylate, 2-ethylhexyl acrylate, benzyl acrylate, furfuryl acrylate, ethoxyethoxyethyl acrylate, dicyclohexyloxyethyl acrylate, nonylpheny. loxyethyl acrylate, hexanediol diacrylate, butanediol diacrylate, neopentylglycol diacrylate, trimethylolpropane triacrylate, pentaerythritol tetraacrylate, dipentaerythritol pentaacrylate, dipentaerythritol hexacrylate, diacrylate of polyoxyethylenated bisphenol A, diacrylate of 2,2-dimethyl-3-hydroxypropane aldehyde and trimethylolpropane condensate, triacrylate of 2,2-dimethyl-3-hydroxypropionaldehyde and pentaerythritol condensate, polyacrylate of hydroxypolyether, polyester acrylate and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. The light-sensitive material containing a mixture of two or more polymerizable compounds is described in Japanese Patent Provisional Publication No. 62(1987)-210445. Further, compounds formed by bonding a polymerizable group such as a vinyl group or a vinylidene group to a reducing agent is also employed as the polymerizable compounds. The light-sensitive materials using compounds which show functions as both the reducing agent and the polymerizable compound or both the color image-forming substance and the polymerizable compound are included in embodiments of the light-sensitive material employable in the invention.

The amount of the polymerizable compound to be contained in the light-sensitive layer preferably ranges from 5 to 120,000 parts by weight, and more preferably from 12 to 12,000 parts by weight, per one part by weight of the silver halide.

Among the above-described components, the silver halide and the polymerizable compound are contained in a microcapsule (i.e., light-sensitive microcapsule). In the microcapsule are preferably contained the reducing agent and the color image-forming substance (described later). The light-sensitive material in which the oily droplet of the polymerizable compound is in the form of microcapsule is described in Japanese Patent Provisional Publication No. 1(1986)-278441. There is no specific limitation on the process for the formation of the microcapsule, and any known process can be applied to the invention. The shell materials of the microcapsule are described above.

In the light-sensitive material of the present invention, the shell of the microcapsules preferably contains the silver halide. Light-sensitive material containing the silver halide in the shell of the microcapsules is described in Japanese Patent Provisional Publication No. 62(1987)-169147.

There can be employed two or more kinds of microcapsules in combination which are different from each other in at least one component among the components capable of being contained in microcapsules such as a silver halide, a reducing agent, a polymerizable compound and a color image forming substance (optional component, described hereinafter). Especially in the case of forming a full-color image, three or more kinds of microcapsules having different color phases are preferably employed in combination. Light-sensitive material using two or more kinds of microcapsules in combination is described in Japanese Patent Provisional Publication No. 62(1987)-198850.

The mean particle size of the microcapsules preferably is in the range of 3 to 20 μm. The microcapsule preferably has a homogeneous particle distribution as described in Japanese Patent Provisional Publication No. 63(1988)-5334. The thickness of the shell of the microcapsule preferably is larger than a certain value against the particle diameter of the microcapsule as described in Japanese Patent Provisional Publication No. 63(1988)-81336.

In the case that the silver halide grains are contained in microcapsules, the mean grain size of the silver halide preferably is not more than one fifth parts of the mean size of the microcapsules, more preferably not more than one tenth parts of the mean size of the microcapsules. When the mean size of the microcapsules is not more than one fifth parts of the mean grain size of silver halide, even and uniform image can be obtained.

The light-sensitive material can be prepared by arranging a light-sensitive layer containing the above-mentioned components on a support. There is no specific limitation with respect to the support. In the case that heat development is utilized in the use of the light-sensitive material, a material for the support preferably is resistant to heat given in the developing stage. Examples of the material employable for the preparation of the support include glass, paper, fine paper, coat paper, cast-coat paper, synthetic paper, metals and analogues thereof, films of polyester, acetyl cellulose, cellulose ester, polyvinyl acetal, polystyrene, polycarbonate and polyethylene terephthalate, and paper laminated with resin or polymer (e.g., polyethylene).

In the case that a porous material such as paper is employed as the support, the porous support preferably has a certain smoothness as described in Japanese Patent Provisional Publication No. 62(1987)-209529. As the paper support, there can be employed various paper supports such as a paper support having a low water absorption described in Japanese Patent Provisional Publication No. 63(1988)-38934; a paper support having a certain Bekk Smoothness described in Japanese Patent Provisional Publication No. 63(1988)-47754, a paper support having a low shrinkage ratio described in Japanese Patent Provisional Publication No. 63(1988)-81339; a paper support having a low permeation rate described in Japanese Patent Provisional Publication No. 63(1988)-81340, and a paper support having a pH value of 5 to 9 described in Japanese Patent Provisional Publication No. 673(1988).97941.

Various embodiments of the light-sensitive materials, optional components which may be contained in the light-sensitive layer, and auxiliary layers which may be optionally arranged on the light-sensitive layer are described below.

Examples of the optional components which may be contained in the light-sensitive layer include color image-forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, anti-halation dyes or pigments, antiirradiation dyes or pigments, dyes decolored by irradiation with light, matting agents, antismudging agents, plasticizers, water releasers, binders, photopolymerization initiators, solvents of the polymerizable compound, and water soluble vinyl polymers.

In the light-sensitive material, a polymer image can be obtained on the light-sensitive layer having the above-mentioned constitution. Further, a color image can be obtained on the light-sensitive layer by incorporating a color image-forming substance as an optional component into the light-sensitive layer.

There is no specific limitation with respect to the color image-forming substance, and various kinds of substances can be employed. Examples of the color image-forming substance include colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). Light-sensitive materials using the color image-forming substance are described in Japanese Patent Provisional Publication No. 61(1986)-73145. Light-sensitive material using a dye or pigment as the color image-forming substance is described in Japanese Patent Provisional Publication No. 62(1987)-187346. Light-sensitive material using a leuco dye is described in Japanese Patent Provisional publication No. 62(1987)-209436. Light-sensitive material using a triazen compound is described in Japanese Patent Provisional Publication No. 62(1987)-251741. Light-sensitive material using a leuco dye which gives a yellow color is described in Japanese Patent Provisional Publication Nos. 62(1987)-288827 and 62(1987)-288828. Light-sensitive material using a leuco dye which gives a cyan color is described in Japanese Patent Provisional Publication Nos. 63(1988)-53542. Examples of dyes and pigments (i.e., colored substance) employable in the invention include commercially available ones as well as various known compounds described in the technical publications, for example, Yuki Gosei Kagaku Kyokai (ed.), "Handbook of Dyes (in Japanese, 1970)" and Nippon Ganryo Gijutsu Kyokai(ed.,), "New Handbook of pigments (in Japanese, 1977)". Those dyes and pigments can be used in the form of a solution or dispersion.

Examples of the substances which develop to give a color by certain energy include thermochromic compounds piezochromic compounds, photochromic compounds and leuco compounds derived from triarylmethane dyes, quinone dyes, indigoid dyes, azine dyes, etc. Those compounds can develop to give a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of color formation systems are described in Hiroyuki Moriga, "Introduction of Chemistry of Speciality Paper (in Japanese, 1975)", pp. 29-58 (pressure-sensitive copying paper, pp. 87-95 (azography), pp. 118-120 (heat-sensitive color formation by chemical change) or in MSS. of the seminar promoted by the Society of Kinki Chemical Industry, "The Newest Chemistry of Coloring Matter-Attractive Application and New Development as a Functional Coloring Matter", pp. 26-32 (June 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image-forming substance is preferably used in an amount of 0.5 to 20 parts by weight, more preferably 2 to 7 parts by weight, per 100 parts by weight of the polymerizable compound. In the case that the developer is employed, the amount of the developer is preferably in the range of approx. 0.3 to 80 parts by weight per one part by weight of the color former.

In the case of using two kinds of color image forming substances which give a color when they are brought into contact with each other (e.g., color former and a developer), one substance and the polymerizable compound are contained in the microcapsule, and the other is arranged outside of the microcapsule in the light-sensitive layer, with by a color image can be formed on the light-sensitive layer. The light-sensitive material in which a color image can be obtained without using an image-receiving material as described above is described in Japanese Patent Provisional Publication No. 62(1987)-209444.

There is no specific limitation with respect to the nature of the sensitizing dye, and any known sensitizing dyes used in the conventional photographic art may be employed in the light-sensitive material.

The amount of the sensitizing dye to be added generally ranges from approx. $10^{-8}$ to $10^{-2}$ mole per 1 mole of the silver halide.

The sensitizing dye is preferably introduced in the stage of the preparation of the silver halide emulsion. The sensitizing dye can be introduced in the stage of the preparation of the silver halide grains as described in Japanese Patent Provisional Publication No. 62(1987)-947. The sensitizing dye can be also introduced in the stage of the preparation of the silver halide emulsion after preparing the silver halide grains as described in Japanese Patent Provisional Publication No. 62(1987)-210449. Concrete examples of the sensitizing dyes are described in Japanese Patent Provisional Publication Nos. 62(1987)-947 and 62(1987)-210449. The sensitizing dye having a sensitivity within the infrared region can be also employed in combination as described in Japanese Patent Provisional Publication No. 62(1987)-210449.

Incorporated of an organic silver salt into the light-sensitive material is particularly effective for the heat development. The reason is assumed that the organic silver salt takes part in a redox reaction using a silver halide latent image as a catalyst when heated to a temperature of 80° C. or higher. In such case, the organic silver salt is preferably positioned in contact with the silver halide or closely to the silver halide. Examples of the organic compounds employable for forming such organic silver salt include aliphatic or aromatic carboxylic acids, thiocarbonyl group-containing compounds having a mercapto group or an $\alpha$-hydrogen atom, and imino group-containing compounds. Particularly preferred is benztriazole. The organic silver salt is generally used in an amount of from 0.01 to 10 mole, preferably from 0.01 to 1 mole, per 1 mole of the silver halide. Instead of the organic silver salt, an organic compound (i.g., benzotriazole) which can form an organic silver salt in combination with an inorganic silver salt can be incorporated into the light-sensitive layer to obtain the same effect. The light-sensitive material using the organic silver salt is described in Japanese Patent Provisional Publication No. 62(1987)-3246. The above-mentioned organic silver salt is preferably used in an amount of 0.1 to 10 moles, more preferably 0.01 to 1 mole, per 1 mole of the silver halide.

A radical generator which accelerates (or inhibits) polymerization of the reducing agent may be contained in the light-sensitive layer. A light-sensitive material using triazene silver as the radical generator is described in Japanese Patent Provisional Publication No. 62(1987)-195639. A light-sensitive material using a silver diazotate as the radical generator is described in Japanese Patent Provisional Publication No. 62(1987)-195640. A light-sensitive material using an azo compound as the radical generator is described in Japanese Patent Provisional Publication No. 62(1987)-195641.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to the image-receiving layer of the image-receiving material(described hereinafter), or a similar function. The image formation accelerators can be classified into inorganic bases, organic bases, base precursors, oils, surface active agents, compounds functioning as an anti-fogging agent and/or a development accelerator, hot-melt solvents, compounds functioning as antioxidants, and the like, from the viewpoint of physicochemical functions. These groups, however, generally have certain combined functions, that is, two or more of the above-mentioned effects, so that the above classification is for the sake of convenience, and one compound often has a plurality of functions combined.

Examples of the image formation accelerators are given below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent; ammonium hydroxide; hydroxides of quaternary alkylammoniums; and hydroxides of other metals. Preferred examples of the organic bases include aliphatic amines (e.g., trialkylamines, hyiroxylamine and aliphatic polyamines); aromatic amines(e.g., N-alkyl-substituted aromatic amines, N-hydroxyalkyl-substituted aromatic amines and bis[p-(dialkylamino)-phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts of bases with organic acids capable of undergoing decarboxylation by heating, compounds capable of releasing amines through intramolecular nucleophilic substitution, Lossen rearrangement, or Beckmann rearrangement, and the like; and those capable of releasing a base by electrolysis. Examples of the base precursors include guanidine trichloroacetate, piperidine trichloroacetate, morpholine trichloroacetate, p-toluidine trichloroacetate, 2-picoline trichloroacetate, guanidine phenylsulfonyl-acetate, guanidine 4-chlorophenylsulfonylacetate, guanidine 4-methylsulfonylphenylsulfonylacetate, and guanidine 4-acetylaminomethyl propionate.

The bases or the base precursors can be employed in an amount within wide range in the light-sensitive material. The base or base precursor is preferably employed in an amount of not more than 100% by weight, more preferably from 0.1 to 40% by weight, based on the total solid content of the light-sensitive layer. These bases or base precursors can be used singly or in combination.

The light-sensitive material employing the base or base precursors is described in Japanese Patent Provisional Publication No. 62(1987)-264041. Light-sensitive material employing a tertiary amine as the base or base precursor is described in Japanese Patent Provisional Publication No. 62(1987)-170954. A light-sensitive material employing dispersed grains of hydrophobic base compound having a melting point of 80° C. to 180° C. is described in Japanese Patent Provisional Publication No. 62(1987)-209523. A light-sensitive material employing guanidine derivatives having a solubility of not more than 0.1% is described in Japanese Patent Provisional Publication No. 62(1987)-215637. A light-sensitive material employing hydroxides of alkali metals or alkaline earth metals or salt is described in Japanese Patent Provisional Publication No. 62(1987)-09448.

A light-sensitive material employing acetylide compounds as the base precursor is described in Japanese Patent Provisional Publication No. 63(1988)-24242. A light-sensitive material employing salts of propiolic acid as the base precursor and further containing silver, copper, silver compound or copper compound as the catalyst of the base production reaction is described in Japanese Patent Provisional Publication No. 63(1988)-46446. A light-sensitive material containing the salts of propiolic acid under the condition of being separated from the silver, copper, silver compound or copper compound is described in Japanese Patent Provisional Publication No. 63(1988)-81338. A light-sensitive material containing free ligands in addition to the salts of propiolic acid and the silver, copper, silver compound or copper compound is described in Japanese Patent Provisional Publication No. 63(1988)-97942. A light-sensitive material employing salts of the propiolic acid as the base precursor and further containing heat fusible compounds as the accelerator of the base production reaction is described in Japanese Patent Provisional Publication No. 63(1988)-46447. A light-sensitive material employing a salt of sulfonyl acetate as the base precursor and further containing heat fusible compound as the accelerator for the base production reaction is described in Japanese Patent Provisional Publication No. 63(1988)48543. A light-sensitive material employing compounds in which isocyanate or isothiocyanate is bonded to an organic base is described in Japanese Patent Provisional Publication No. 63(1988)-24242.

In the case of using the base or the base precursor in the light-sensitive material, it is preferred that the silver halide, the reducing agent and the polymerizable compound are contained in the aforementioned microcapsules, and the base or base precursor is arranged outside of the microcapsule in the light-sensitive layer. Otherwise, the base or base precursor can be contained in different microcapsules from those containing the polymerizable compound as described in Japanese Patent Provisional Publication No. 62(1987)-209521. The base or base precursor can be contained in the microcapsules under the condition that the base or base precursor is dissolved or dispersed in an aqueous solution of a water retention agent as described in Japanese Patent Provisional Publication No. 62(1987)-209522, or under condition that the base or base precursor is adsorbed on solid particles as described in Japanese Patent Provisional Publication No. 62(1987)-209526. The base or base precursor contained in the microcapsules preferably has a melting point in the range of 70° to 210° C. as described in Japanese Patent Provisional Publication No. 63(1988)-65437. Further, the base or base precursor can be dissolved in grains in combination with hyirophobic substance as described in Japanese Patent Provisional Publication No. 63(1988)-97943.

The base or base precursor can be contained in a layer different from the light-sensitive layer as described in Japanese Patent Provisional Publication No. 62(1987)-253140. The layer containing a base or base precursor will be described hereinafter. Further, the base or base precursor may be contained in the aforementioned porous support as described in Japanese Patent Provisional Publication No. 63(1988)-32546.

Examples of the oils employable in the invention include high-boiling organic solvents which are used as solvents for emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent provisional Publication No. 59(1984)-57231.

The compounds functioning as an anti-fogging agent and/or a development accelerator can be used to give an image of high sharpness having a high maximum density and a low minimum density (i.e., an image having high S/N ratio). Examples of the compounds functioning as an anti-fogging agent and/or a development accelerator include a conventional anti-fogging agent described in Japanese Patent Provisional Publication No. 62(1987)-151838; a compound having a cyclic amido structure described in Japanese Patent Provisional Publication No. 61(1986)-151841; a thioether compound described in Japanese Patent Provisional Publication No. 62(1987)-151842; a polyethylene glycol derivative described in Japanese Patent Provisional Publication No. 62(1987)-151843; a thiol derivative described in Japanese Patent Provisional Publication No,. 62(1987)-151844; an acetylene compound described in Japanese Patent Provisional Publication No. 62(1987)-178232; a sulfonamide derivative described in Japanese Patent Provisional Publication No. 62(1987)-183450; and a salt of quaternary ammonium ion described in Japanese Patent Provisional Publication No. 63(1988)-91653.

The hot-melt solvent preferably is a compound which may be used as a solvent of the reducing agent or one which has high dielectric constant and can accelerate physical development of silver salts. A light-sensitive material employing the hot-melt solvent is described in Japanese Patent Provisional Publication No. 62(1987)-86355.

The compounds functioning as an antioxidant can be employed for the purpose of eliminating the oxygen influence (oxygen functions as a polymerization inhibitor). An example of the compound functioning as an antioxidant is a compound having two or more mercapto groups as described in Japanese Patent Provisional Publication No. 62(1987)-09443.

The thermal polymerization initiators employable in the light-sensitive material are compounds which are decomposed under heating to generate a polymerization initiating species, particularly a radical, and those generally employed as an initiator of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). The thermal polymerization initiator is preferably used in an amount of from 0.1 to 120% by weight, more preferably from 1 to 10% by weight, based on the amount of the polymerizable compound. In a system in which the polymerizable compound within the area where the latent image has not been formed is polymerized, the thermal polymerization initiator is preferably incorporated into the light-sensitive layer. The light-sensitive material using the thermal polymerization initiators is described in Japanese Patent Provisional Publication No. 62(1987)-70836.

The development stopping agents employable in the light-sensitive material are compounds to neutralize a base or react with a base to reduce the base concentration in the layer to hereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are in the form of particles which are solid at ambient temperatures. Examples of the anti-smudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 $\mu$m, more preferably 5 to 40 $\mu$m. The size of the particle is preferably larger than that of the microcapsule. In the case that the oily droplets of the polymerizable compound is in the form of microcapsules, the size of the particle is preferably larger than that of the microcapsule.

The binder employable in the light-sensitive material can be contained in the light-sensitive layer singly or in combination. The binder preferably is a hydrophilic binder, and representative hydrophilic binders are transparent or semi-transparent binders. The light-sensitive material using the binder is described in Japanese Patent Provisional Publication No. 61(1986)-69062. The light-sensitive material using both of the binder and the microcapsules is described in Japanese Patent Provisional Publication No. 62(1987)-209525.

A photopolymerization initiator can be contained in the light-sensitive later of the light-sensitive material for the purpose of polymerization of the transferred unpolymerized polymerizable compound, as described in Japanese Patent Provisional Publication No. 62(1987)-61149.

In the case of using a solvent for the polymerizable compound, the solvent is preferably contained in a microcapsule which is different from the microcapsule containing the polymerizable compound. The light-sensitive material employing a polymerizable compound contained in a microcapsule and a blending organic solvent is described in Japanese Patent Provisional Publication No. 62(1987)-209524.

A water soluble vinyl polymer can be adsorbed on the aforementioned silver halide grains. The light-sensitive material employing the water soluble vinyl polymer is described in Japanese Patent Provisional Publication No. 63(1988)-91652.

Examples and usage of other components than the abovementioned ones which can be optionally contained in the light-sensitive layer are also described in the above-mentioned publications concerning the light-sensitive material, and in Research Disclosure Vol. 170, No. 17029, pp. 9–15 (June 1978).

The light-sensitive layer of the light-sensitive material comprising the above-mentioned components preferably has a pH value of not more than 7 as described in Japanese Patent Provisional Publication No. 62(1987)-275235.

Examples of auxiliary layers which are optionally arranged on the light-sensitive layer include a heating layer, an antistatic layer, an anti-curling layer, a peel layer, a cover sheet, a protective layer, a layer containing a base or a base precursor, a base barrier layer and an anti-halation layer (colored layer).

Instead of using an image-receiving material (described later), the above-mentioned image-receiving layer can be provided on the light-sensitive material to form an image on the image-receiving layer. The structure of the image-receiving layer provided on the light-sensitive material can be the same as that of the image-receiving material.

A light-sensitive material using a heating layer is described in Japanese Patent Provisional Publication No. 61(1986)-294434. A light-sensitive material provided with a cover sheet or a protective layer is described in Japanese Patent Provisional Publication No. 62(1987)-210447. A light-sensitive material provided a layer containing a base or base precursor is described in Japanese Patent Provisional Publication No. 62(1987)-253140. A light-sensitive material provided with a colored layer as the anti-halation layer is described in Japanese Patent Provisional Publication No. 63(1988)-101842. A light-sensitive material provided with a base barrier layer is described in Japanese Patent Provisional Publication No. 62(1987)-253140. Examples of other auxiliary layers and usage thereof are described in the above-mentioned publications concerning the light-sensitive materials.

The process for the preparation of a light-sensitive material is described below.

Various processes can be employed for preparing a light-sensitive material. In a generally known process, a light-sensitive material can be prepared by dissolving, emulsifying or dispersing each of the components of the light-sensitive layer in an adequate solvent to obtain a coating solution, then applying the solution onto the aforementioned support, and drying the coated layer of the solution.

The coating solution can be generally prepared by preparing liquid compositions, each composition containing each component, and mixing those compositions with each other. Each of the liquid compositions may contain plural components. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Processes for the preparation of the liquid composition and the coating solution are described below.

The silver halide emulsion can be prepared by any known processes such as an acid process, a neutral process or an ammonia process.

In the stage for the preparation, a soluble silver salt and a soluble halogen salt can be reacted in accordance with a single jet process, a double jet process or a combination thereof. A reverse mixing method in which grains are formed in the presence of excess silver ions, or a controlled double jet process in which a pAg value is maintained constant, can be also employed. In order to accelerate grain growth, the concentrations or amounts of the silver salt and halogen salt to be added or the rate of their addition can be increased as described in Japanese Patent Provisional Publications Nos. 55(1980)-158124 and 55(1980)-158124 and U.S. Pat. No. 3,650,757.

The silver halide emulsion may be of a surface latent image type that forms a latent image predominantly on the surface of silver halide grains, or of an inner latent image type that forms a latent image predominantly in the inside of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Provisional Publication No. 58(1983)-3534 and Japanese Patent Publication No. 58(1983)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No 2,635,316.

In the preparation of the silver halide emlusion, various hydrophilic colloids are advantageously used as protective colloids. Examples of employable hydrophilic colloids include proteins (e.g., gelatin, gelatin derivatives, gelatin grafted with other polymers, albumin and casein), cellulose derivatives (e.g., hydroxyethyl cellulose and cellulose sulfate), saccharide derivatives (e.g., sodium alginate and starch derivative), and a wide variety of synthetic hydrophilic polymers, such as polyvinyl alcohol, partially acetalized polyvinyl alcohol, poly-N-vinylpyrrolidone, polyacrylic acid, polymethacrylic acid, polyacrylamide, polyvinylimidazole, and polyvinylpyrazole and copolymers comprising monomers constituting these homopolymers. Among them, gelatin is most preferred. Examples of the employable gelatin include not only lime-treated gelatin but also acid-treated gelatin and enzyme-treated gelatin. Hydrolysis products or enzymatic decomposition products of gelatin can be also employed.

In the formation of silver halide grains in the silver halide emulsion, ammonia, an organic thioether derivative (see: Japanese Patent Publication No. 47(1972)-386) or sulfur-containing compound (see: Japanese Patent Provisional Publication No. 53(1987)-144319) can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. For the chemical sensitization of the emulsion employable for the light-sensitive material, there can be employed sulfur sensitization, reduction sensitization or noble metal sensitization, etc, singly or in combination. Those chemical sensitization processes can be carried out in the presence of a nitrogen containing heterocyclic compound as described in Japanese Patent Provisional Publications Nos.58(1983)-126526 and 58(1983)-215644.

When a sensitizing dye is added to the silver halide emulsion, the sensitizing dye is preferably added in the stage of preparation of the emulsion as described in the above-mentioned Japanese Patent Provisional Publication Nos. 62(1987)-947 and 62(1987)-210449. When the nitrogen-containing heterocyclic compound functioning as an anti-fogging agent and/or a development accelerator is added to the silver halide emulsion, the compound is preferably added in the stage of the formation or ripening of the silver halide grains. The process for the preparation of the light-sensitive material employing the nitrogen-containing heterocyclic compound is described in Japanese Patent Provisional Publication No. 62(1987)-161144.

When the organic silver salt is contained in the light-sensitive layer, the emulsion of the organic silver salt can be prepared in a similar manner to that in the preparation of the silver halide emulsion.

In the preparation of the light-sensitive material, the polymerizable compound can be used as a medium for the preparation of a liquid composition containing other components of the light-sensitive layer. For example, the silver halide (including silver halide emulsion), reducing agent (including the hydrazine derivative functioning as the reducing agent), color image-forming substance, and the like can be dissolved or emulsified in the polymerizable compound. Especially when the color image-forming substance is used, the substance is preferably introduced into the polymerizable compound. Further, when the oily droplets of the polymerizable compound are made in the form of microcapsules, components of the shell material may be contained in the polymerizable compound.

A light-sensitive composition containing the polymerizable compound which contains the silver halide can be prepared using the silver halide emulsion. Otherwise, a silver halide powder prepared by lyophilization can be also employed other than the silver halide emulsion to prepare the light-sensitive composition. The light-sensitive composition can be obtained by stirring the polymerizable compound and the silver halide using a homogenizer, a blender, a mixer or other conventional stirring device.

A copolymer consisting of hydrophilic repeating unit and hydrophobic repeating unit is preferably dissolved in the polymerizable compound employed in the preparation of the light-sensitive composition, as described in Japanese Patent Provisional Publication No. 62(1987)-209449.

The light-sensitive composition can be also prepared by dispersing microcapsules containing silver halide emulsion as a core material in the polymerizable compound instead of employing the above copolymer, as described in Japanese Patent Provisional Publication No. 62(1987)-164041.

The polymerizable compound or the above-mentioned light-sensitive composition which further contains other components is preferably employed in the form of an emulsion in which the compound or the composition is emulsified in an aqueous medium. In the case of preparing microcapsules of oily droplets containing the polymerizable compound, it is possible that the shell material required for the preparation of microcapsules is added to the emulsion and the emulsion is then subjected to a process for forming a shell of microcapsule, as described in Japanese Patent Provisional Publication No. 61(1986)-275742. Otherwise, to the emulsion may be also added a reducing agent or other optional components.

Examples of the processes for preparing microcapsules (encapsulation processes) include a process utilizing coacervation of a hydrophilic shell material as described in U.S. Pat. Nos. 2,800,457 and 2,800,458; an interface polymerization process as described in U.S. Pat. No. 3,287,154, British Patent No. 990,443, and Japanese Patent Publication Nos. 38(1963)-19574, 42(1967)-446 and 42(1967)-771; a polymer deposition process as described in U.S. Pat. Nos. 3,418,250 and 3,660,304; a process using an isocyanate-polyol shell material as described in U.S. Pat. No. 3,796,669; a process using an isocyanate shell material as described in U.S. Pat. No. 3,914,511; a process using an urea-formaldehyde or urea-formaldehyde-resorcinol shell material as described in U.S. Pat. Nos. 4,001,140, 4,087,376 and 4,089,802; a process using a shell material such as melamine-formaldehyde resin or hydroxypropyl cellulose as described in U.S. Pat. No. 4,025,455; an in-situ process utilizing polymerization of monomers as described in Japanese Patent Publication No. 36(1961)-9168 and Japanese Patent Provisional Publication No. 51(1976)-9079; a polymerization-dispersion cooling process as described in U.K. Patent Nos. 927,807 and 965,074; and a spray-drying process as described in U.S. Pat. No. 3,111,407 and U.K. Patent No. 930,422. The process for encapsulation of oily droplets of the polymerizable compound is by no means restricted to the above-mentioned processes, but most preferred is a process comprising emulsifying a core material and then forming a polymer film as a shell of the microcapsule around the core material.

When the polymerizable compound is a light-sensitive composition containing the silver halide, the obtained emulsion of the polymerizable compound (including a microcapsule dispersion obtained by the above-mentioned process) can be employed per se as a coating solution for preparing a light-sensitive material. When the light-sensitive composition does not contain the silver halide, the obtained emulsion can be mixed with other emulsions such as silver halide emulsion and an emulsion containing other optional component (e.g., organic silver salt) to prepare a coating solution. Other optional components can be also added to the coating solution.

The coating solution prepared as above is coated over a support, and the coated layer of the solution is dried to prepare a light-sensitive material. Coating of the solution over the support can be readily performed by known processes.

Use of the light-sensitive material of the present invention is described below.

The image-forming method (namely use of the light-sensitive material) comprises imagewise exposing to light the light-sensitive material and developing the light-sensitive material to form a polymer image.

Various exposure means can be employed in the imagewise exposure, and in general, a latent image of the silver halide is obtained by imagewise exposure to radiation including visible light. The kind of light source or the amount of light employed in the exposure can be selected depending on the light-sensitive wavelength determined by spectral sensitization or sensitivity of silver halide. An original image can be either monochromatic image or color image.

Development of the light-sensitive material can be conducted simultaneously with or after the imagewise exposure. The development can be conducted using a developing solution in the same manner as the image-forming method described in Japanese Patent Publication No. 45(1970)-11149. The image-forming method described in Japanese Patent Provisional Publication No. 61(1986)-69062 which employs a heat development process has an advantage of simple procedures and short processing time. Therefore, the latter method is preferred as the development process of the light sensitive material.

Heating in the heat development process can be conducted in various known manners. A heating layer which is arranged on the light-sensitive material can be used as the heating means, as described in the aforementioned Japanese Patent Provisional Publication No. 61(1986)-294434. The heat development process can be conducted under restraining the amount of oxygen in the light-sensitive layer, as described in Japanese Patent Provisional Publication No. 62(1987)-210461. Heating temperature for the development process usually ranges from 80° C. to 200° C., and preferably from 100° C. to 160° C. The heating time is usually not shorter than 1 second, preferably from 1 second to 5 minutes, more preferably from 1 second to 1 minute.

The development process can be carried out simultaneously with or after adding the aforementioned base or base precursor instead of incorporating the base or the base precursor into the light-sensitive material. For introducing the base or the base precursor into the light-sensitive layer, there is known a method of using a sheet containing the base or the base precursor (i.e., base sheet). The method of using the base sheet is most easy and preferred. The image-forming method using the base sheet is described in Japanese Patent Provisional Publication No. 63(1988)-32546.

The light-sensitive material is subjected to the heat development process as described above to polymerize the polymerizable compound within the area where a latent image of the silver halide has been formed or the area where a latent image of the silver halide has not been formed. Generally, the polymerizable compound is polymerized within the area where a latent image of the silver halide has been formed in the heat development process. However, the polymerizable compound within the area where a latent image of the silver halide has not been formed can be also polymerized by adjusting the kind or the amount of the reducing agent as described in Japanese Patent Provisional Publication No. 62(1987)-70836.

In the above-mentioned development process, a polymer image can be formed on the light-sensitive layer. A color image can be also obtained by fixing a dye or pigment on the polymer image.

As described in Japanese Patent Provisional Publication No. 62(1987)-209444, a color image can be formed on the light-sensitive material using two kinds of substances which form a color when brought into contact with each other. In this method, one of the substances is contained in microcapsules dispersed in the light-sensitive layer and the other is arranged outside of the microcapsules, and the light-sensitive material having been subjected to the development process is pressed to rupture the microcapsules so as to being into contact the two kinds of substances with each other.

An image-receiving material can be employed to form a polymer image.

The image-receiving material employable in the above-mentioned image-forming method is described below. The image-forming method using the image-receiving material or an image-receiving layer is described in Japanese Patent Provisional Publication No. 61(1986)-278849.

As the support of the image-receiving material, there can be employed a baryta paper in addition to various materials employable as the support of the light-sensitive material. In the case that a porous material such as paper is employed as the support of the image-receiving material, the porous support preferably has a certain smoothness as described in Japanese Patent Provisional Publication No. 62(1987)-209530. An image-receiving material employing a transparent support is described in Japanese Patent Publication No. 62(1987)-209531.

The image-receiving material is usually prepared by providing an image-receiving layer on the support. The image-receiving layer can be constructed using a variety of compounds according to the color formation system. In the cases that a polymer image is formed on the image-receiving material and that a dye or pigment is employed as the color image forming substance, the image receiving material can be composed of the support only.

For example, when a color formation system using a color former and a developer is employed, the developer can be contained in the image-receiving layer. Otherwise, the image-receiving layer can be composed of at least one layer containing a mordant. The mordant can be selected from various compounds which are known in the art of the conventional photography in consideration of nature of the color image forming substance. If desired, the image-receiving layer can be composed of two or more layers containing a plurality of mordants different from each other in the mordanting power.

The image-receiving layer preferably contains a polymer as a binder. The binder which is employable for the aforementioned light-sensitive layer can be also employed for the image-receiving layer. Further, a polymer having a lower transmission coefficient of oxygen can be used as the binder, as described in Japanese Patent Provisional Publication No. 62(1987)-209454.

The image-receiving layer can contain a thermoplastic compound. In the case that the thermoplastic compound is contained in the image-receiving layer, the image-receiving layer itself is preferably composed of an agglomerate of fine particles of the thermoplastic compound (i.e., granulated thermoplastic compound). The image-receiving layer having the above constitute has such advantages that the formation of a transferred image can be readily done and a glossy image can be obtained under heating after the image formation. There is no specific limitation on the thermoplastic compounds, and a variety of thermoplastic compounds such as conventional thermoplastic resins (plastics) and waxes can be employed. However, the glass transition point of the thermoplastic resin or the melting point of the wax preferably is not higher than 200° C. The image receiving material having an image-receiving layer containing the granular thermoplastic compound is described in Japanese Patent Provisional Publication Nos. 62(1987)-280071 and 62(1987)-280739.

A photopolymerization initiator or a thermal polymerization initiator may be contained in the image-receiving layer. In the image-formation process using an image-receiving material, a color image-forming substance is transferred together with the unpolymerized polymerizable compound as described hereinafter, so that the photopolymerization initiator or thermal polymerization initiator can be contained in the image-receiving layer to smoothly perform the curing procedure (fixing procedure) of the unpolymerized polymerizable compound The image-receiving material having the image-receiving layer containing a photopolymerization initiator is described in Japanese Patent Provisional Publication No. 62(1987)-161149. The image-receiving layer containing a thermal polymerization initiator is described in Japanese Patent Provisional Publication No. 62(1987)-210444.

A dye or pigment can be contained in the image-receiving layer for the purpose of entering letters, symbols, frames, etc. in the image receiving layer, or of giving a certain color to the background for the image. Further, the dye or pigment can be also employed for the purpose of making it easy to distinguish the sides of the image-receiving material. As the dye or pigment, there can be employed a variety of known dyes or pigments employable for the image formation. However, in the case that the dye or pigment may disturb the image formed on the image-receiving layer, it is preferred to make the density of the dye or pigment low (e.g., reflection density of not higher than 1), or to employ a dye or pigment having a property of being discolored when it is heated or irradiated with light. The image-receiving material comprising the image-receiving layer which contains a dye or pigment having a property of being discolored when it is heated or irradiated with light is disclosed in Japanese Patent Provisional Publication No. 62(1987)-251741.

Further, when a white pigment such as titanium dioxide and barium sulfate is contained in the image-receiving layer, the image-receiving layer can function as a white reflection layer. In this case, the white pigment is used in an amount of 10 to 100 g based on 1 g of the thermoplastic compound.

The above-mentioned dye and pigment can be either uniformly or partially contained in the image-receiving layer. For example, when the support is composed of transparent material, the white pigment can be partially contained in the image-receiving layer to make a part of a reflection image transparent. Thus, information of the image which is unnecessary in the transparent image can be entered in the part of the image-receiving layer containing the white pigment as a reflection image.

The image-receiving layer can be composed of two or more layers according to the above mentioned functions. The thickness of the image receiving layer preferably ranges from 1 to 100 μm, more preferably from 1 to 20 μm.

A protective layer can be provided on the surface of the image-receiving layer. A layer composed of an agglomerate of granulated thermoplastic compound can be also provided on the surface of the image-receiving layer as described in Japanese Patent Provisional Publication No. 2(1987)-210460.

Further, other various layers such as a layer containing a self-adhesive or adhesive and a release paper can be laminated on the surface of the support not facing the image-receiving layer. A sticker type image-receiving material having the above structure is described in Japanese Patent Provisional Publication No. 63(1988)-24647.

In the case of using the image receiving material, the light-sensitive material is subjected to the aforementioned development process, then pressed on the image-receiving material to transfer the unpolymerized polymerizable compound to the image-receiving material, whereby a polymer image can be formed on the image-receiving material. For applying a pressure on the light-sensitive material, various known methods can be employed.

In the case that the light-sensitive layer contains a color image-forming substance, the light-sensitive material is subjected to the heat development process to cure the polymerizable compound, and thereby the color image-forming substance in the cured portion is fixed. Then, the light-sensitive material is pressed on the image-receiving material to transfer the color image-forming substance in the uncured portion to the image-receiving material. Thus, a color image can be formed on the image-receiving material.

After the image is formed on the image-receiving material, the image-receiving material can be heated to polymerize the transferred unpolymerized polymerizable compound as described in Japanese Patent Provisional Publication No. 62(1987)-210459. Through the above-mentioned process, the obtained image can be improved in the preservability.

Various image recording apparatus suitable for conducting the image-forming method using the light-sensitive material are known, and they are described for example in Japanese Patent Provisional Publication No. 62(1987)-147461.

The light-sensitive material of the invention can be used for monochromatic or color photography, printing, radiography, medical diagnosis (e.g., CRT photography of diagnostic device using ultrasonic wave), copy (e.g., computer-graphic hard copy), etc.

The present invention is further described by the following examples without limiting the invention.

EXAMPLE 1

[Preparation of Light-sensitive Material]

Preparation of silver halide emulsion (A)

In 1,200 ml of water were dissolved 24 g of gelatin and 1.2 g of sodium chloride, and the resulting gelatin solution was adjusted to pH 3.2 using 1N-sulfuric acid and was kept at 60° C. To the gelatin solution, 600 ml of aqueous solution containing 117 g of potassium bromide and 600 ml of aqueous solution containing 0.74 mole of silver nitrate were added simultaneously at the same feed rate over 15 minutes. After 5 minute, to the resulting mixture was further added 200 ml of aqueous solution containing 4.3 g of potassium iodide over 5 minutes. To the resulting emulsion was then added 1.2 g of polyisobutylene/monosodium maleate copolymer.

After the emulsion was washed with water for desalting, 24 g of gelatin was added to the emulsion. Further, to the resulting emulsion were added 5 mg of sodium thiosulfate and 0.47 g of the following sensitizing dye (1) to chemically sensitize the emulsion at 60° C. for 15 minutes. Thus, a silver halide emulsion (A) (blue-sensitive, yield: 1,000 g) was obtained.

(Sensitizing dye (1))

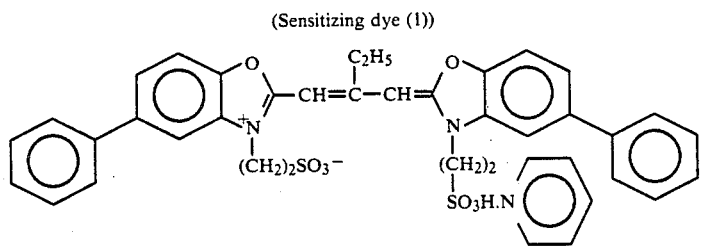

Preparation of light sensitive composition (A)

In 100 g of the following polymerizable compound (tradename: Kayarad R-604, available from Nippon Kayaku Co., Ltd.) were dissolved 1.6 g of the following copolymer, 20.0 g of Pargascript Red I-6-B (tradename of Ciba-Geigy) and 0.43 g of p-toluenesulfonamide.

(Polymerizable compound)
(Copolymer)

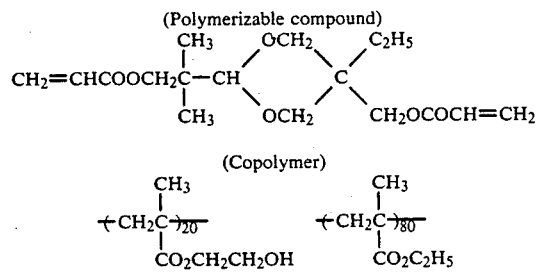

Then, to 90.0 g of the resulting solution were added 6.10 g of the following developing agent (reducing agent (I)), 6.45 g of the following hydrazine derivative (reducing agent (II)), 8.75 mg of the following anti-fogging agent, 1.8 g of the following surface active agent (tradename: Emalex NP-8, available from Nippon Emulsion Co., Ltd.) and 20.0 g of methylene chloride to prepare a homogeneous solution.

(Reducing agent (I))

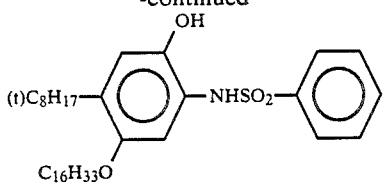

(Reducing agent (II))

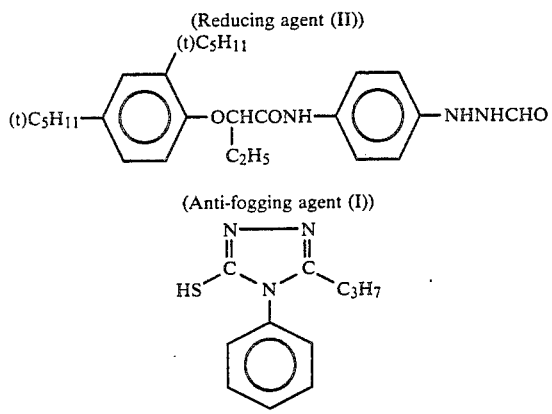

(Anti-fogging agent (I))

Separately, to 10.0 g of the above prepared silver halide emulsion was added 2.3 g of a 10% aqueous solution of potassium bromide, and the mixture was stirred for 5 minutes.

The mixture was then added to the above-obtained homogeneous solution, and the resulting mixture was stirred at 15,000 r.p.m. for 5 minutes at 25° C. using a homogenizer to obtain a light-sensitive composition (A) in the form of a W/O emulsion.

Preparation of light-sensitive microcapsule dispersion (A)

To the light-sensitive composition (A) was added 4.5 g of a polyisocyanate compound (tradename:Takenate D110N of Takeda Chemical Industries, Ltd.), and the mixture was stirred for 5 minutes. The mixture was added to 208 g of a 10% aqueous solution of sodium salt of polyvinyl-benzene sulfonic acid (tradename: VERSA TL-502, available from National Starch, Co.) having been adjusted to pH 6.0 using a 20% aqueous solution of phosphoric acid or a 10% aqueous solution of sodium hydroxide. The resulting mixture was heated to 40° C. and stirred at 7,000 r.p.m. for 30 minutes using a homogenizer to obtain a W/O/W emulsion.

Independently, to 40.35 g of distilled water were added 7.5 g of melamine and 12.35 g of a 37% aqueous solution of formaldehyde, and the resulting mixture was heated to 60° C. and stirred for 30 minutes to obtain a transparent aqueous solution of melamine-formaldehyde precondensate.

The aqueous solution of the precondensate was added to the above-prepared W/O/W emulsion which was kept at 25° C., and the resulting mixture was adjusted to pH 6.0 using a 20% aqueous solution of phosphoric acid. The mixture was then heated to 65° C. and stirred for 90 minutes.

Then, to the mixture was added 27 g of 40% aqueous solution of urea, and the mixture was adjusted to pH 3.5 using 20% aqueous solution of phosphoric acid. The mixture was heated to 60° C. and stirred for 40 minutes. After the mixture was cooled to room temperature, the mixture was adjusted to pH 7.0 using 10% aqueous solution of sodium hydroxide, to obtain a light-sensitive microcapsule dispersion (A) containing microcapsules having melamine-formaldehyde resin shell.

Preparation of base precursor dispersion (A)

In 160 g of 4% aqueous solution of polyvinyl alcohol (tradename:PVA.-205, available from Kuraray Co,. Ltd.) was dispersed 40 g of the following base precursor.

(Base precursor)

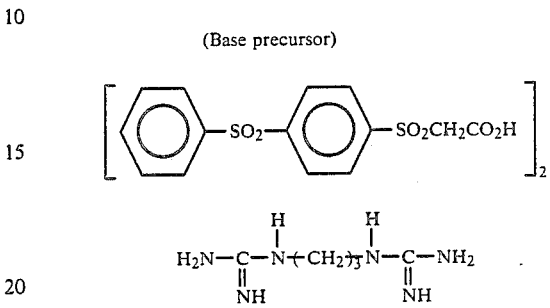

The resulting dispersion was finely dispersed using Dinomill dispersing device at 3,000 r.p.m. for 2 hours, to obtain a base precursor dispersion (A).

Preparation of light-sensitive material (A)

To 30 g of the above-prepared microcapsule dispersion (A) were added 7.0 g of the base precursor dispersion (A), g of 10% aqueous solution of perfluoroalkylphosphate (fluorine-containing compound, tradename:-Surfluon S-112, available from Asahi Glass Co., Ltd.), 9.0 g of 20% aqueous solution of sorbitol, 4.0 g of 5% aqueous solution of a surface active agent (tradename: Emalex NP-8, Nippon Emulsion Co., Ltd.) and distilled water, to obtain 88 ml of a coating solution for the formation of a light-sensitive layer. The coating solution was coated over a paper support in an amount of 75 ml/m², and the coated layer of the solution was dried at 60° C. for 30 minutes to prepare a light-sensitive material (A) of the present invention.

COMPARISON EXAMPLE 1

Preparation of light-sensitive material (X)

The procedures of Example 1 were repeated except for using water instead of perfluoroalkylphosphate (fluorine-containing compound, tradename: Surfluon S-112, available from Asahi Glass Co., Ltd.) in the same amount as that of Surfluon S-112, to prepare a light-sensitive material (X) for comparison.

EXAMPLE 2

Washing of light-sensitive microcapsule dispersion

The light-sensitive microcapsule dispersion (A) obtained in Example 1 was subjected to centrifugal separation at 1,000 r.p.m. for 20 minutes using a centrifugal separator and settled the microcapsules. The supernatant liquid is removed to obtain a sediment of the microcapsules. To the sediment was added distilled water, and the resulting dispersion was sufficiently stirred.

The above washing procedure was further repeated twice under the same conditions. The obtained microcapsule dispersion was so adjusted as to have the same concentration of the solid content as that of the dispersion prior to the washing procedure.

Preparation of base precursor dispersion (B)

The procedure for preparing the base precursor dispersion (A) in Example 1 was repeated except for using cationmodified polyvinyl alcohol (tradename: PVA-C-318-2A, available from Kuraray Co., Ltd.) instead of polyvinyl alcohol (tradename: PVA-205, available from Kuraray Co., Ltd.), to prepare a base precursor dispersion (B).

Preparation of coating solution

To 30 g of the above-obtained washed light-sensitive microcapsule dispersion were successively added 7.0 g of the base precursor dispersion (B), 3 g of 20% aqueous solution of perfluoroalkylphosphate (tradename: Surfluon S-112, available from Asahi Glass Co., Ltd.), 9.0 g of 20% aqueous solution of sorbitol, 4.0 g of 5% aqueous solution of a surface active agent (tradename: Emalex NP-8, available from Nippon Emulsion Co., Ltd.), 20 g of 4% aqueous solution of methyl cellulose (tradename: Metholose 65SH, available from Shinetsu Chemical Industry Co.,Ltd.) and 15 g of distilled water, to prepare a coating solution for the formation of a light-sensitive layer.

COMPARISON EXAMPLE 2

Preparation of light-sensitive material (Y)

The procedures of Example 2 were repeated except for using water instead of perfluoroalkylphosphate (fluorine-containing compound, tradename: Surfluon S-112, available from Asahi Glass Co., Ltd.) used for preparing the light-sensitive material (B) in the same amount as that of Surfluon S-112, to prepare a light-sensitive material (Y) for comparison.

EXAMPLE 3

Preparation of light-sensitive material (C)

The procedures of Example 2 were repeated except for using perfluoroalkylcarboxylate (tradename: Surfluon S-111, available from Asahi Glass Co., Ltd.) as a fluorine compound instead of Surfluon S-112 in the same amount as that of Surfluon S-112, to prepare a light-sensitive material (C) of the present invention.

EXAMPLE 4

Preparation of light-sensitive material (D)

The procedures of Example 2 were repeated except for using perfluoroalkylethylene oxide addition product (tradename: Surfluon S-145, available from Asahi Glass Co., Ltd.) as a fluorine compound instead of Surfluon S-112 in the same amount as that of Surfluon S-112, to prepare a light-sensitive material (D) of the present invention.

EXAMPLE 5

Preparation of light-sensitive composition (E)

In 100 g of the polymerizable compound (tradename: Kayarad R-604, available from Nippon Kayaku Co., Ltd.) used in Example 1 were dissolved 1.6 g of the copolymer used in Example 1, 20.0 g of the following magenta color image-forming substance and 0.43 g of p-toluenesulfonamide. To 90.0 g of the resulting solution were added 6.50 g of the following developing agent (reducing agent (III)), 2.37 g of the following hydrazine derivative (reducing agent (IV)), 0.01 g of the following anti-fogging agent (II), 1.8 g of a surface active agent (tradename: Emalex NP-8, available from Nippon Emulsion Co., Ltd.) and 20.0 g of methylene chloride, to prepare a homogeneous solution.

Separately, to 10.0 g of the silver halide emulsion (A) used in Example 1 was added 2.3 g of 10% aqueous solution of potassium bromide, and the resulting mixture was stirred for 5 minutes.

Then, the mixture was added to the above-obtained homogeneous solution, and the resulting mixture was stirred at 15,000 r.p.m. for 5 minutes using a homogenizer at 25° C. to prepare a light-sensitive composition (E) in the form of a W/O emulsion.

(Magenta color image-forming substance)

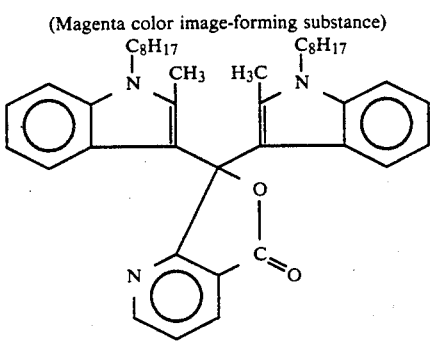

(Reducing agent (III))

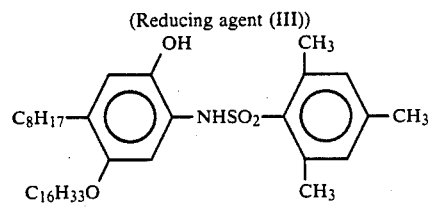

(Reducing agent (IV))

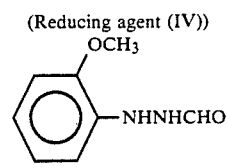

(Anti-fogging agent (II))

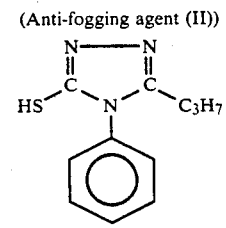

Preparation of light-sensitive microcapsule dispersion (E)

To the above-obtained light-sensitive composition (E) was added an isocyanate compound (tradename: Barnoc D-750, available from Dainippon Ink & Chemicals Inc.), and the mixture was stirred at 5,000 r.p.m. for 1 minute. The mixture was introduced into an aqueous solution obtained by dissolving 9.4 g of polyvinyl alcohol (tradename: Poval 05, available from Kuraray Co., Ltd.) having been adjusted to pH 5.5 using a 20% aqueous solution of phosphoric acid and 4.71 g of carboxymethyl cellulose (tradename: Celogen 7A, available from Dai-Ichi Kogyo Seiyaku Co.,Ltd.) in 139 g of water. The resulting mixture was stirred at 1,200 r.p.m. for 5 minutes, and to the mixture was added water to obtain 376 g of a W/O/W emulsion. Then, the emulsion was heated to 60° C. and stirred at 500 r.p.m. for 90 minutes. Further, the emulsion was adjusted to pH 6.5 using 10% aqueous solution of sodium hydroxide, to prepare a light-sensitive microcapsule dispersion (E).

Preparation of light-sensitive material (E)

To 30 g of the above-obtained microcapsule dispersion (E) were added 7.0 g of the base precursor dispersion (A) used in Example 1, 3 g of 10% aqueous solution of perfluoroalkylphosphate (fluorine-containing compound, tradename: Surfluon S-112, available from Asahi Glass Co., Ltd.), 0.2 g of a surface active agent (tradename: Emalex NP-8, available from Nippon Emulsion Co., Ltd.) and distilled water, to obtain 88 ml of a coating solution for the formation of a light-sensitive layer.

The coating solution was coated on a paper support in the same manner as described in Example 1, to prepare a light-sensitive material (E) of the present invention.

COMPARISON EXAMPLE 3

Preparation of light-sensitive material (Z)

The procedures of Example 5 were repeated except for using water instead of perfluoroalkylphosphate (fluorine-containing compound, tradename: Surfluon S-112, available from Asahi Glass Co., Ltd.) in the same amount as that of Surfluon S-112, to prepare a light-sensitive material (Z) for comparison.

Preparation of image-receiving material

To 125 g of water was added 11 g of 40% aqueous solution of sodium hexametaphosphate, and to the mixture were further added 34 g of zinc 3,5-di-αmethylbenzylsalicylate and 82 g of 55% slurry of calcium carbonate, followed by coarsely dispersing in a mixer. The resulting coarse dispersion was then finely dispersed in Dynomill dispersing device. To 200 g of the resulting dispersion were added 6 g of 50% latex of SBR and 55 g of 8% aqueous solution of polyvinyl alcohol, and the resulting mixture was made uniform to give a coating solution for the formation of an image-receiving layer. The coating solution was evenly coated on an art paper having basis weight of 43 g/m² to give a coated layer having wet thickness of 30 μm. The coated layer was then dried to prepare an image-receiving material.

[Evaluation of Light-sensitive Material]

Each of the light-sensitive materials prepared in Examples 1 to 5 and Comparison Examples 1 to 3 was superposed on the above-obtained image-receiving material, and they were passed through press rollers under pressure of 550 kg/cm² to obtain a magenta positive image on the image-receiving material. The magenta image obtained on the image-receiving material was measured on the density using Macbeth reflection densitometer. The measured density (density of transferred image with no exposing and developing treatment) almost corresponds to a density in the case that the unpolymerized polymerizable compound in the unexposed area were completely transferred.

Further, each of the light-sensitive materials was imagewise exposed to light using a tungsten lamp at 2,000 lux for 1 second through a continuous filter having a transmission density of 0 to 3.0. Then, each of the light-sensitive materials was subjected to heat development on a hot plate heated to 140° C. or 155 ° C. for periods of 10, 15, 20 and 25 seconds. Each of the light-sensitive materials was then superposed on the image-receiving material and they were passed through press rollers under pressure of 550 kg/cm² to obtain a magenta positive image on the image-receiving material. The magenta positive image on the image receiving material was measured on the maximum density and the minimum density using Macbeth reflection densitometer.

The results are set forth in Table 1. The minimum density of the image given by each of the light-sensitive materials was not higher than 0.1 in all cases.

TABLE 1

| Light-sensitive Material | Density of transferred Image with no treatment | Developing Temp. (°C.) | Maximum Density | | | |
|---|---|---|---|---|---|---|
| | | | 10 | 15 | 20 | 25 |
| | | | (Seconds) | | | |
| (A) | 1.30 | 155 | 1.20 | 1.17 | 1.15 | 1.10 |
| (X) | 1.23 | 155 | 1.15 | 1.10 | 1.05 | 0.90 |
| (B) | 1.34 | 140 | 1.30 | 1.25 | 1.22 | 1.22 |
| (C) | 1.36 | 140 | 1.30 | 1.27 | 1.25 | 1.20 |
| (D) | 1.33 | 140 | 1.28 | 1.25 | 1.25 | 1.20 |
| (Y) | 1.26 | 140 | 1.02 | 0.90 | 0.86 | 0.80 |
| (E) | 1.25 | 155 | 1.15 | 1.05 | — | — |
| (Z) | 1.20 | 155 | 1.02 | 0.87 | — | — |

As is evident from the results set forth in Table 1, the density of the transferred image with no exposing and developing treatment given by each of the light-sensitive materials (A) to (E) of the invention which contained a fluorine-containing compound is higher than that given by the light-sensitive materials (X), (Y) and (Z) for comparison which contained no fluorine-containing compound. Further, the maximum density of the image given by the light-sensitive materials of the invention is still high even in the case that the developing time is made longer, as compared with the light-sensitive materials for comparison.

Moreover, each of the light-sensitive materials (A) to (E) of the invention was more easily separated from the image-receiving material after transferring of the image under pressure than the light-sensitive materials (X) to (Z) for comparison, and the transferred images given by the light-sensitive materials of the invention had smaller surface roughness (that is, agglomeration of microcapsules less occurred in the preparation of the light-sensitive material) than the transferred images given by the light-sensitive materials for comparison.

EXAMPLE 6

[Preparation of Light-sensitive Material]

Preparation of silver halide emulsion (F-1)

In 1,000 ml of water were dissolved 20 g of gelatin and 1.0 g of sodium chloride, and the resulting gelatin solution was adjusted to pH 3.8 using 1N-sulfuric acid and was kept at 65° C. To the gelatin solution, 600 ml of aqueous solution containing 70 g of potassium bromide and 600 ml of aqueous solution containing 0.59 mole of silver nitrate were added simultaneously at the same feed rate over 50 minutes. After 5 minutes, to the resulting mixture were further added 100 ml of aqueous solution containing 4.9 g of potassium iodide and 100 ml of aqueous solution containing 0.01 mole of silver nitrate at the same feed rate over 5 minutes. Thus, a silver iodobromide (14-hedron) monodispersed emulsion having an average grain size of the silver iodobromide of 0.24 μm.

After the emulsion was washed with water for desalting, 20 g of gelatin and 74 ml of 1% methanol solution of the following sensitizing dye (2) were added to the emulsion. Thus, a silver halide emulsion (F-1) (blue-sensitive, yield: 500 g) was obtained.

(Sensitizing dye (2))

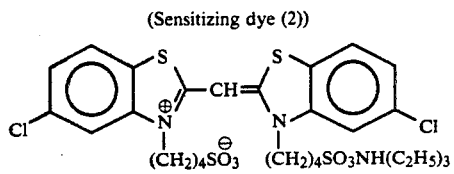

Preparation of silver benzotriazole emulsion 28 g of gelatin and 14 g of benzotriazole were dissolved in 3,000 ml of water, and the resulting solution was kept at 40° C. Under stirring, to the solution was added 100 ml of aqueous solution containing 17 g of silver nitrate over 2 minutes. The pH value of the resulting emulsion was adjusted to settle the extra salt, and the salt was removed from the emulsion. Then, the obtained emulsion was adjusted to pH 7.00. Thus, a silver benzotriazole emulsion was obtained. The yield of the emulsion was 400 g.

Preparation of silver halide emulsion (F-2)

In 1,600 ml of water were dissolved 20 g of gelatin and 0.5 g of sodium chloride, and the resulting gelatin solution was adjusted to pH 3.2 using 1N-sulfuric acid and was kept at 42° C. To the gelatin solution, 200 ml of aqueous solution containing 71 g of potassium bromide and 200 ml of aqueous solution containing 0.59 mole of silver nitrate were added simultaneously at the same feed rate over 30 minutes. After 1 minute, to the resulting mixture were added 48 ml of 1% methanol solution of the sensitizing dye (1) used in Example 1, and then after 10 minutes to the mixture were further added 100 ml of aqueous solution containing 2.9 g of potassium iodide and 100 ml of aqueous solution containing 0.018 mole of silver nitrate simultaneously over 5 minutes. To the resulting emulsion was then added 1.2 g of polyisobutylene/monosodium maleate copolymer.

After the emulsion was washed with water for desalting, to the emulsion was added 18 g of gelatin and was further added 0.7 mg of sodium thiosulfate to chemically sensitize the emulsion at 60° C. for 15 minutes. Thus, a silver iodobromide (14-hedron) monodispersed emulsion having an average grain size of the silver iodobromide of 0.12 μm (silver halide emulsion (F-2), green-sensitive, yield: 1,000 g) was obtained.

Preparation of silver halide emulsion (F-3)

In 1,600 ml of water were dissolved 20 g of gelatin and 0.5 g of sodium chloride, and the resulting gelatin solution was adjusted to pH 3.5 using 1N-sulfuric acid and was kept at 45° C. To the gelatin solution, 200 ml of aqueous solution containing 71 g of potassium bromide and 200 ml of aqueous solution containing 0.59 mole of silver nitrate were added simultaneously at the same feed rate over 30 minutes. After 1 minute, to the resulting mixture was added 48 ml of 0.5% methanol solution of the following sensitizing dye (3), and then after 15 minutes to the mixture were further added 100 ml of aqueous solution containing 3.65 g of potassium iodide and 100 ml of aqueous solution containing 0.022 mole of silver nitrate at the same feed rate over 5 minutes. To the resulting emulsion was then added 1.2 g of polyisobutylene/monosodium maleate copolymer.

After the emulsion was washed with water for desalting, to the emulsion was added 10 g of gelatin and was further added 0.45 mg of sodium thiosulfate to chemically sensitize the emulsion at 55° C. for 20 minutes. Thus, a silver iodobromide (14-hedron) monodispersed emulsion having an average grain size of the silver iodobromide of 0.13 μm (silver halide emulsion (F-3), red-sensitive, yield: 1,000 g) was obtained.

(Sensitizing dye (3))

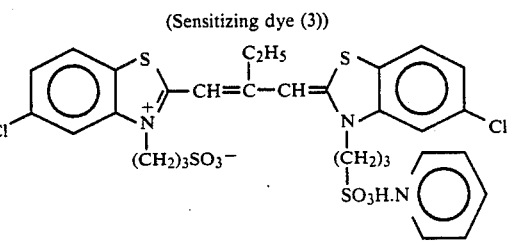

Preparation of light-sensitive composition (F-1)

In 83 g of the polymerizable compound used in Example 1 were dissolved 0.77 g of the copolymer used in Example 1, 0.36 g of p-toluenesulfonamide and 12.5 g of the following yellow color image-forming substance. To the resulting solution were added 6.1 g of the reducing agent (I) used in Example 1, 6.4 g of the reducing agent (II) used in Example 1, 0.09 g of the following development inhibitor-releasing precursor, 0.01 g of the anti-fogging agent (II) used in Example 5, 1.8 g of a surface active agent (tradename: Emalex NP-8, available from Nippon Emulsion Co., Ltd.) and 20.0 g of methylene chloride, to prepare an oily solution.

Separately, to 15 g of the above-obtained silver halide emulsion (F-1) were added 1.5 ml of 10% aqueous solution of potassium bromide, 0.5 ml of 0.08% 1-methoxy-2-methylpropanol solution of the following reducing agent (V) and 1.5 ml of 1% aqueous solution of polyvinyl pyrrolidone (K-15), and the resulting mixture was stirred for 5 minutes.

The mixture containing the silver halide emulsion was added to the above-obtained oily solution, and the resulting mixture was stirred at 15,000 r.p.m. for 5 minutes using a homogenizer to prepare a light-sensitive (blue-sensitive) composition (F-1) in the form of a W/O emulsion.

(Yellow color image-forming substance)

-continued

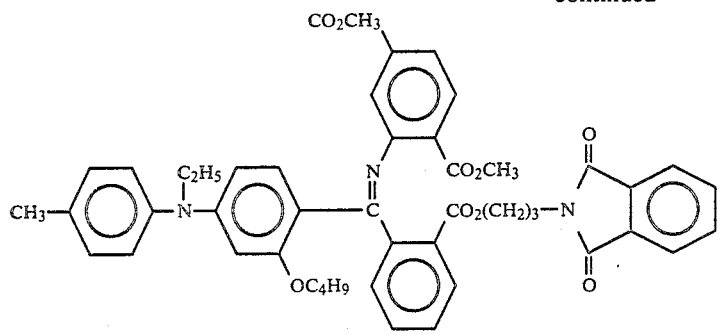

(Reducing agent (V))

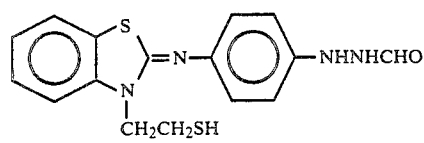

(Development inhibitor-releasing precursor)

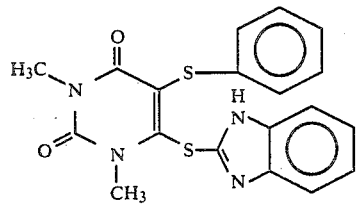

Preparation of light-sensitive composition (F-2)

The procedure for preparing the light-sensitive composition (F-1) was repeated except for using the silver halide emulsion (F-2) instead of the silver halide emulsion (F-1) in the same amount as that of the silver halide emulsion (F-1), using 20 g of the following magenta color image-forming substance instead of the yellow color image-forming substance, and using 0.015 g of the aforementioned anti-fogging agent (II), to prepare a light-sensitive (green-sensitive) composition (F-2).

(Magenta color image-forming substance)

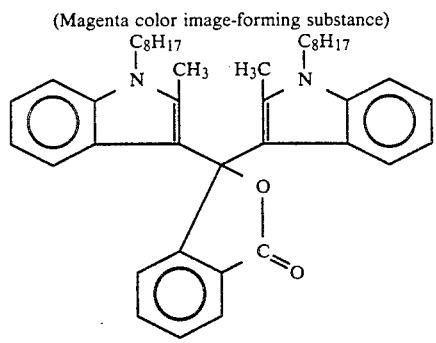

Preparation of light-sensitive composition (F-3)

The procedure for preparing the light-sensitive composition (F-1) was repeated except for using the silver halide emulsion (F-3) instead of the silver halide emulsion (F-1) in the same amount as that of the silver halide emulsion (F-1), using 16 g of the following cyan color image-forming substance instead of the yellow color image-forming substance, and using 0.0075 g of the aforementioned anti-fogging agent (II), to prepare a light-sensitive (red-sensitive) composition (F-2).

(Cyan color image-forming substance)

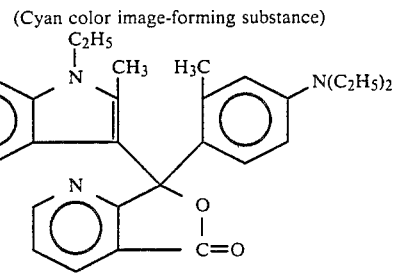

Preparation of light-sensitive microcapsule dispersion (F-1)

To the light-sensitive composition (F-1) was added 4.5 g of a polyisocyanate compound (tradename: Takenate D110N of Takeda Chemical Industries, Ltd.). The mixture was added to 210 g of 10% aqueous solution of sodium salt of polyvinyl-benzene sulfonic acid (tradename: VERSA TL-502, available from National Starch, Co.) having been adjusted to pH 6.0 using 10% aqueous solution of sodium hydroxide. The resulting mixture was heated to 40° C. and stirred at 9,000 r.p.m. for 30 minutes using a homogenizer to obtain a W/O/W emulsion.

Independently, to 13.2 g of melamine were added 21.6 g of 37% aqueous solution of formaldehyde and 70 g of distilled water, and the resulting mixture was stirred at 60° C. for 30 minutes to obtain a transparent aqueous solution of melamine-formaldehyde precondensate.

77 g of the aqueous solution of the precondensate was added to the above-prepared W/O/W emulsion, and the resulting mixture was adjusted to pH 6.0 using 20% aqueous solution of phosphoric acid. The mixture was then heated to 60° C. and stirred for 120 minutes.

Further, to the mixture was added 27 g of 40% aqueous solution of urea, and the mixture was adjusted to pH 3.5. The mixture then was heated to 60° C. and stirred at 1,000 r.p.m.for 40 minutes. Finally, the mixture was adjusted to pH 6.5, and was cooled to room temperature. Thus, a light-sensitive (blur-sensitive) microcapsule dispersion (F-1) was obtained.

Preparation of light-sensitive microcapsule dispersion (F-2)

The procedure for preparing the light-sensitive microcapsule dispersion (F-1) was repeated except for using the light-sensitive composition (F-2) instead of the light-sensitive composition (F-1), to prepare a light-sensitive (green-sensitive) microcapsule dispersion (F-2).

Preparation of light-sensitive microcapsule dispersion (F-3)

The procedure for preparing the light-sensitive microcapsule dispersion (F-1) was repeated except for using the light-sensitive composition (F-3) instead of the light-sensitive composition (F-1), to prepare a light-sensitive (red-sensitive) microcapsule dispersion (F-3).

Preparation of light-sensitive material (F)

16 g of the light-sensitive microcapsule dispersion (F-1), 18.5 g of the light-sensitive microcapsule dispersion (F-2), 14.8 g of the light-sensitive microcapsule dispersion (F-3), 6.8 g of the base precursor dispersion (A) used in Example 1, 9 ml of 20% aqueous solution of sorbitol and 10 ml of 10% aqueous solution of starch (tradename: KF-5, available from Shinshin Foods Industry Ltd.) were mixed with each other. To the resulting aqueous mixture were then added 4 ml of 5% aqueous solution of the following surface active agent and 5 ml of 10% aqueous solution of perfluoroalkylphosphate (fluorine-containing compound, tradename: Surfluon S-112, available from Asahi Glass Co., Ltd.), to obtain 85 g of a coating solution for the formation of a light-sensitive layer.

The coating solution was coated on the aforementioned paper support in an amount of 50 g/m², and the coated layer of the solution was dried at approx. 60° C. to prepare a light-sensitive material (F) of the present invention.

(Surface active agent)

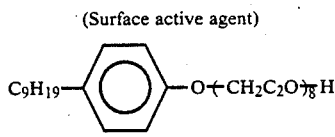

COMPARISON EXAMPLE 4

The procedures of Example 6 were repeated except for using 5 ml of water instead of 5 ml of 10% aqueous solution of perfluoroalkylphosphate (fluorine-containing compound, tradename: Surflon S-112, available from Asahi Glass Co., Ltd.), to prepare a light-sensitive material (W) for comparison.

[Evaluation of Light-sensitive Material]

Using each of the above-obtained light-sensitive materials (F) and (W), the image-forming method was performed in the same manner as described in Example 1 except that the temperature for the development was made 155° C. and the time therefor is made 10, 15 and 20 seconds, to evaluate the light-sensitive materials.

The results are set forth in Table 2. The minimum density of the obtained image given by each of the light-sensitive materials (F) and (W) was not higher than 0.1.

TABLE 2

| Light-sensitive Material | Density of transferred Image with no treatment | Developing Temp. (°C.) | Maximum Density 10 | 15 (Seconds) | 20 |
|---|---|---|---|---|---|
| (F) | 1.25 | 155 | 1.17 | 1.13 | 1.08 |
| (W) | 1.16 | 155 | 1.10 | 0.95 | 0.83 |

As is evident from the results set forth in Table 2, the density of the transferred image with no exposing and developing treatment given by the light-sensitive material (F) of the invention which contained a fluorine-containing compound is higher than that given by the light-sensitive material (W) for comparison which contained no fluorine-containing compound. Further, the maximum density of the image given by the light-sensitive material of the invention is still high even in the case that the developing time is made longer, as compared with the light-sensitive material for comparison.

Moreover, the image given by the light-sensitive material of the invention had smaller surface roughness than the image given by the light-sensitive material for comparison.

I claim:

1. A light-sensitive material comprising a support and a light-sensitive layer provided thereon which contains silver halide, a reducing agent and an ethylenically unsaturated polymrizable compound, at least said silver halide and said polymerizable compound being contained in a microcapsule;
   wherein the light-sensitive layer further contains a fluorine atom-containing compound adsorbed on a shell of the microcapsule.

2. The light-sensitive material as claimed in claim 1, wherein the fluorine atom-containing compound is contained in the light-sensitive layer in an amount of 0.05 to 1.5 g/m².

3. The light-sensitive material as claimed in claim 1, wherein the fluorine atom-containing compound is adsorbed on a shell of the microcapsule in an amount of 0.5 to 30 wt. % based on the amount of the microcapsule.

4. The light-sensitive material as claimed in claim 1, wherein the fluorine atom-containing compound is a fluorine-containing surface active agent.

5. The light-sensitive material as claimed in claim 1, wherein the fluorine atom containing compound is a fluorine-containing surface active agent selected from the group consisting of perfluoroalkylphosphate, perfluoroalkylcarboxylate, perfluoroalkylethylene oxide addition products, perfluoroalkylbetaine and perfluoroalkylsulfonate.

6. The light-sensitive material as claimed in claim 1, wherein the shell material of the microcapsule is an amino-aldehyde resin or an urea resin.

7. The light-sensitive material as claimed in claim 1, wherein the light-sensitive layer further contains a color image-forming substance and the color image-forming substance is contained in a microcapsule.

* * * * *